(12) United States Patent
Kim et al.

(10) Patent No.: US 11,600,770 B2
(45) Date of Patent: Mar. 7, 2023

(54) SPIN-ORBIT TORQUE SWITCHING DEVICE WITH TUNGSTEN NITRIDE

(71) Applicant: KOREA UNIVERSITY RESEARCH AND BUSINESS FOUNDATION, Seoul (KR)

(72) Inventors: Young Keun Kim, Seoul (KR); Yong Jin Kim, Seoul (KR); Min Hyeok Lee, Yangsan-si (KR)

(73) Assignee: Korea University Research and Business Foundation, Seoul (KR)

(*) Notice: Subject to any disclaimer, the term of this patent is extended or adjusted under 35 U.S.C. 154(b) by 241 days.

(21) Appl. No.: 17/088,850

(22) Filed: Nov. 4, 2020

(65) Prior Publication Data

US 2021/0296575 A1    Sep. 23, 2021

(30) Foreign Application Priority Data

Mar. 19, 2020    (KR) .................. 10-2020-0033574

(51) Int. Cl.
*H10N 50/85* (2023.01)
*H10B 61/00* (2023.01)
(Continued)

(52) U.S. Cl.
CPC ........... *H01L 43/10* (2013.01); *H01F 10/329* (2013.01); *H01L 27/222* (2013.01); *H01L 43/02* (2013.01); *H01L 43/08* (2013.01)

(58) Field of Classification Search
CPC ....... H01L 27/222; H01L 43/02; H01L 43/08; H01F 10/329
See application file for complete search history.

(56) References Cited

U.S. PATENT DOCUMENTS

2016/0079518 A1    3/2016 Pi et al.
2017/0316813 A1*   11/2017 Lee .................. G11C 11/02
(Continued)

FOREIGN PATENT DOCUMENTS

JP    2016-46492 A    4/2016
JP    2017-59594 A    3/2017
(Continued)

OTHER PUBLICATIONS

Gwang-Guk An et al., Highly enhanced perpendicular magnetic anisotropic features in a CoFeB/MgO free layer via WN diffusion barrier, Acta Materialia 110 (2016) 217-225 (Year: 2016).*

(Continued)

*Primary Examiner* — Shih Tsun A Chou
(74) *Attorney, Agent, or Firm* — NSIP Law

(57) ABSTRACT

A magnetic device includes a pinned layer having a fixed magnetization direction, a free layer having a switched magnetization direction, a tunnel insulating layer interposed between the pinned layer and the free layer, and a spin-torque generation layer injecting spin current into the free layer as in-plane current flows. The spin current allows a magnetization direction of the free layer to be switched by a spin-orbit torque. The pinned layer and the free layer have perpendicular magnetic anisotropy. The spin-torque generation layer includes a tungsten layer and a tungsten-nitride layer sequentially stacked. The tungsten-nitride layer is disposed adjacent to the free layer.

10 Claims, 19 Drawing Sheets

(51) Int. Cl.

| | |
|---|---|
| *H10N 50/80* | (2023.01) |
| *H10N 50/10* | (2023.01) |
| *H01F 10/32* | (2006.01) |
| *H01L 43/10* | (2006.01) |
| *H01L 27/22* | (2006.01) |
| *H01L 43/02* | (2006.01) |
| *H01L 43/08* | (2006.01) |

(56) References Cited

U.S. PATENT DOCUMENTS

| | | |
|---|---|---|
| 2020/0006626 A1 | 1/2020 | Smith et al. |
| 2020/0006630 A1 * | 1/2020 | Sato ............... G11C 11/161 |

FOREIGN PATENT DOCUMENTS

| | | |
|---|---|---|
| JP | 2017-59679 A | 3/2017 |
| JP | 2019-110326 A | 7/2019 |
| KR | 10-2015-0018413 A | 2/2015 |
| KR | 10-2015-0054804 A | 5/2015 |
| KR | 101729383 B1 * | 4/2017 ............. H01L 43/02 |

OTHER PUBLICATIONS

An Gwang-Guk et al., "Highly Enhanced Perpendicular Magnetic Anisotropic Features in a CoFeB/MgO Free Layer via WN Diffusion Barrier" *Acta Materialia, Elsevier*, Oxford, GB, vol. 110, Mar. 22, 2016, (pp. 217-225).

Extended European Search Report dated Jun. 17, 2021 in counterpart European Patent Application No. 20208789.6 (6 pages in English).

* cited by examiner

W(5nm)/WN$_x$(t$_{W-N}$=0.2 nm)/CoFeB(0.9nm)/MgO(1nm)/Ta(2nm)

W(5nm)/WN$_x$(t$_{W-N}$=0.2 nm)/CoFeB(0.9nm)/MgO(1nm)/Ta(2nm)

W(5nm)/WN$_x$(n=29%)/CoFeB(0.9nm)/MgO(1nm)/Ta(2nm)

W(5nm)/WN$_x$(t$_{W-N}$=0.2nm)/CoFeB(0.9nm)/MgO(1nm)/Ta(2nm)

W(5nm)/WN$_x$(n=29%)/CoFeB(0.9nm)/MgO(1nm)/Ta(2nm)

W(5nm)/WN$_x$(t$_{W-N}$=0.2nm)/CoFeB(0.9nm)/MgO(1nm)/Ta(2nm)

SPIN-ORBIT TORQUE SWITCHING DEVICE WITH TUNGSTEN NITRIDE

CROSS-REFERENCE TO RELATED APPLICATIONS

This U.S. non-provisional patent application claims priority under 35 U.S.C. § 119 to Korean Patent Application No. 10-2020-0033574, filed on Mar. 19, 2020, in the Korean Intellectual Property Office, the entire contents of which are hereby incorporated by reference.

TECHNICAL FIELD

The present disclosure relates to a spin-orbit torque (SOT)-based switching device and, more particularly, to an SOT-based switching device, including a tungsten/tungsten nitride multilayer thin film, capable of performing SOT switching at low current.

BACKGROUND

A spin-orbit torque (SOT) switching-based magnetic random access memory (MRAM) includes a magnetic tunnel junction (MTJ) as a core element.

FIG. 1 illustrates a conventional magnetic tunnel junction (MTJ).

Referring to FIG. 1, a magnetic tunnel junction (MTJ) 10 includes a spin-torque generation layer/a free layer/a tunnel barrier layer/a pinned layer.

An electrical resistance value of tunneling current, passing through a tunnel barrier layer 16, varies depending on a relative magnetization direction of a free layer 14 and a pinned layer 18. A magnetic tunnel junction 10 stores data using such a tunneling magnetoresistance (TMR) effect.

The magnetic tunnel junction 10 may have perpendicular magnetic anisotropy (PMA) characteristics to achieve a high tunnel magnetoresistance (TMR) ratio, high recording stability, low recording current, and high integration density. The term "perpendicular magnetic anisotropy (PMA)" means that a magnetization direction of a magnetic layer is perpendicular to a magnetic layer surface.

When in-plane current Ic flows through a spin-torque generation layer 12 adjacent to the free layer 14, the spin torque generating layer 12 may induce switching of the free layer 14 using a spin-orbit torque (SOT) originating from a spin Hall effect or a Rashba effect. The spin-orbit torque may write data at higher speed, lower current, and lower power consumption than a writing method of a spin-transfer torque (STT).

However, a material and a structure of a spin-torque generation layer, allowing magnetization reversal of a free layer to be induced by injecting lower current, are required to commercialize a spin-orbit torque (SOT) MRAM.

SUMMARY

Example embodiments of the present disclosure provide an SOT-MRAM performing a write operation that executes a recording operation at low switching critical current. When a spin torque generating layer which is in contact with a free layer to provide in-plane current includes a tungsten/tungsten nitride multilayer thin film, a spin-orbit torque effect of the SOT-MRAM is improved and switching critical current for a write operation is decreased. The tungsten-nitride layer may include nitrogen-doped tungsten or tungsten nitride.

Example embodiments of the present disclosure provide an SOT-MRAM in which a perpendicular magnetic anisotropy is exhibited at a predetermined thickness and a predetermined nitrogen concentration of a tungsten nitride when a tungsten/tungsten nitride structure is used as a spin Hall generating layer.

Example embodiments of the present disclosure an SOT-MRAM operating even in harsh environments of low and high temperatures, and then normally operating even after a temperature returns to a normal temperature.

Example embodiments of the present disclosure provide an SOT-MRAM performing a zero-field switching operation while having low critical current.

A magnetic device according to an example embodiment includes a pinned layer having a fixed magnetization direction, a free layer having a switched magnetization direction, a tunnel insulating layer interposed between the pinned layer and the free layer, and a spin-torque generation layer injecting spin current into the free layer as in-plane current flows. The spin current allows a magnetization direction of the free layer to be switched by a spin-orbit torque. The pinned layer and the free layer have perpendicular magnetic anisotropy. The spin-torque generation layer includes a tungsten layer and a tungsten-nitride layer sequentially stacked. The tungsten-nitride layer is disposed adjacent to the free layer.

In an example embodiment, a thickness of the tungsten-nitride may be 0.2 nm, and nitrogen atomic percent of the tungsten-nitride layer may be 5% to 42%.

In an example embodiment, nitrogen atomic percent of the tungsten-nitride layer may be 2% to 29%, and a thickness of the tungsten-nitride may be 0.2 nm to 0.8 nm.

In an example embodiment, nitrogen atomic percent of the tungsten-nitride layer may be 2% to 5%, and a thickness of the tungsten-nitride may be 0.2 nm to 3 nm.

In an example embodiment, the tungsten-nitride layer may include a crystalline $W_2N$ (111) phase. Alternatively, the tungsten-nitride layer may include a crystalline $W_2N$ (111) phase and a crystalline WN (100) phase.

In an example embodiment, the tungsten layer may be vertically aligned with the free layer.

In an example embodiment, the spin-torque generation layer may further include a ferromagnetic layer having in-plane magnetic anisotropy, and the tungsten layer may be disposed between the ferromagnetic layer and the tungsten-nitride layer.

In an example embodiment, resistivity of the tungsten-nitride layer may be 350 $\mu\Omega \cdot cm$ or more.

A magnetic device according to an example embodiment includes a pinned layer having a fixed magnetization direction, a free layer having a switched magnetization direction, a tunnel insulating layer interposed between the pinned layer and the free layer, a spin-torque generation layer injecting spin current into the free layer as in-plane current flows, and a tungsten-nitride layer disposed between the free layer and the spin-torque generation layer. The spin current allows a magnetization direction of the free layer to be switched by a spin-orbit torque. The pinned layer and the free layer have perpendicular magnetic anisotropy. The spin-torque generation layer includes a tungsten layer. The tungsten-nitride layer is vertically aligned with the free layer.

A magnetic device according to an example embodiment includes a pinned layer having a fixed magnetization direction, a free layer having a switched magnetization direction, a tunnel insulating layer interposed between the pinned layer and the free layer, and a spin-torque generation layer injecting spin current into the free layer as in-plane current flows. The spin current allows a magnetization direction of the free layer to be switched by a spin-orbit torque. The pinned layer and the free layer have perpendicular magnetic anisotropy. The spin-torque generation layer includes a tungsten-nitride layer. Nitrogen atomic percent of the tungsten-nitride layer is 2% to 5%. The tungsten-nitride layer is disposed adjacent to the free layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

In a nonmagnet/ferromagnet (NM/FM) structure, magnetization of the ferromagnetic layer FM may be reversed by a spin-orbit torque (SOT) generated when in-plane current is injected into the nonmagnet NM. SOT switching-based memory or logic devices may provide advantages such as lower energy consumption and higher speed switching than spin-transfer-torque-switched devices. However, two main obstacles should be overcome to commercialize the SOT switching-based memory or logic devices. For example, deterministic switching and significantly low switching current are required in the absence of an external magnetic field.

Spin-orbit torque (SOT) may be used to reverse magnetization of a ferromagnet in a nonmagnet/ferromagnet (NM/FM) structure by injecting in-plane current. A spin-orbit torque has attracted significant interest as a novel mechanism for magnetic random access memories. Among various heavy metals, a β-phase tungsten layer exhibits relatively high SOT efficiency. Accordingly, the β-phase tungsten layer is considered as a potential material for a spin current generation layer.

According to an example embodiment, we report an improved SOT and lower SOT-induced switching current in a W/$WN_x$/CoFeB/MgO Hall bar structure. The CoFeB layer was vertically magnetized. The WN layer is subjected to sputtering deposition in a nitrogen reactive environment. A composition of the $WN_x$ layer affects a microstructure and electrical characteristics. Measured SOT efficiency is 0.54, and the switching current is decreased by about one-fifth (⅕) in a sample with 40% to 42% of nitrogen atomic percent, as compared to a sample which does not include the WN layer.

According to an example embodiment, a W/WN/CoFeB/MgO structure may provide low switching current. When an in-plane magnetization ferromagnetic layer is disposed below a tungsten layer, zero-field switching may be implemented.

Hereinafter, the present disclosure will be described in more detail based on preferred embodiments. However, these embodiments are for better understanding of the present disclosure, and it is obvious to those skilled in the art that the scope of the present disclosure is not limited thereto. In addition, in the case in which detailed description of known functions or configurations in relation to the present disclosure is judged as unnecessarily making the essence of the present disclosure vague, the detailed description will be excluded.

Figure 1:
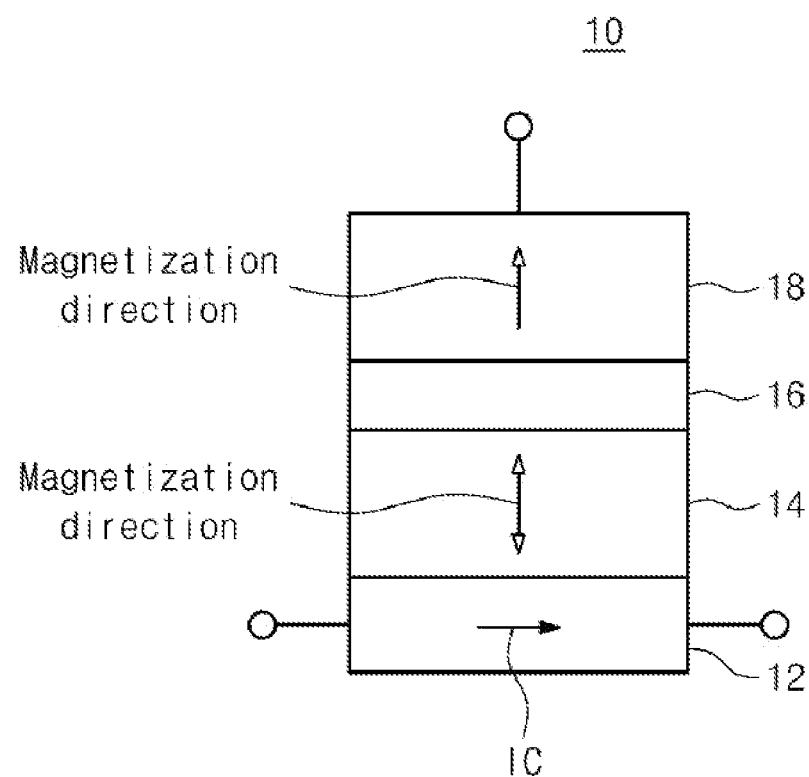
FIG. 1 illustrates a conventional magnetic tunnel junction (MTJ).
Figure 2:
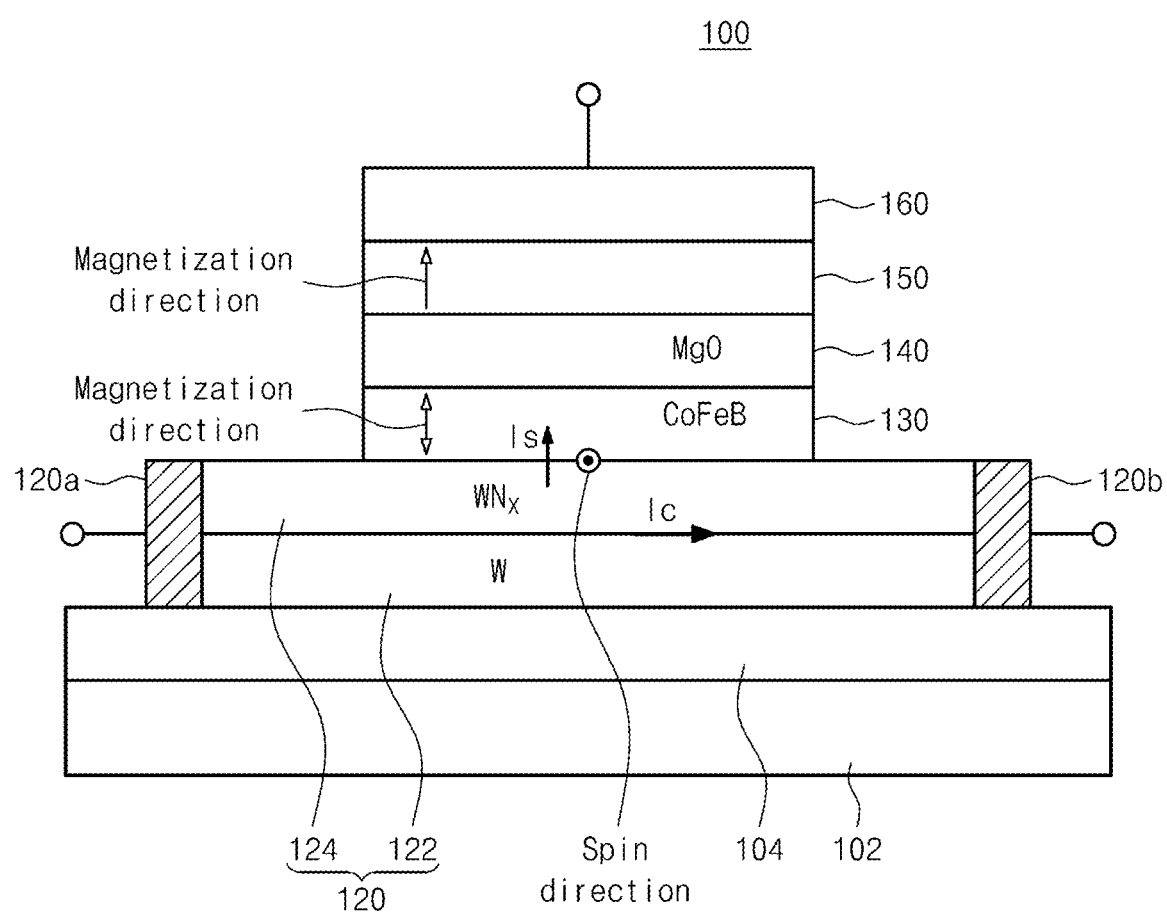
FIG. 2 is a cross-sectional view of a magnetic device according to an example embodiment of the present disclosure.

FIG. 2 is a cross-sectional view of a magnetic device according to an example embodiment of the present disclosure.

Referring to FIG. 2, a magnetic element 100 includes a pinned layer 150 having a fixed magnetization direction, a free layer 130 having a switched magnetization direction, a tunnel insulating layer 140 interposed between the pinned layer 150 and the free layer 130, and a spin-torque generation layer 120 injecting spin current into the free layer 130 as in-plane current Ic flows. The spin current switches a magnetization direction of the free layer 130 using a spin-orbit torque. The pinned layer 150 and the free layer 130 have perpendicular magnetic anisotropy. The spin-torque generation layer 120 includes a tungsten layer 122 and a tungsten-nitride layer 124 sequentially stacked. The tungsten-nitride layer 124 is disposed adjacent to the free layer 130. The magnetic device 100 may be an SOT-MRAM. The pinned layer 150, the tunnel insulating layer 140, and the free layer 130 may constitute a magnetic tunnel junction.

The pinned layer 150 may have a fixed magnetization direction, and may include a ferromagnetic layer having perpendicular magnetic anisotropy. The pinned layer 150 may have a single-layer structure or a multilayer structure.

The free layer 130 may have perpendicular magnetic anisotropy, and may switch the magnetization direction using a spin-orbit torque (SOT). The free layer 130 may include CoFeB having a thickness of 0.9 nm. The free layer 130 may be transformed into a single-layer structure or a multilayer structure.

The tunnel insulating layer 140 may include MgO, having a thickness of 1 nm, as an insulating material through which tunnel current flows. The tunnel insulating layer 140 may be disposed between the pinned layer 150 and the free layer 130.

The spin-torque generation layer 120 may include a nonmagnetic conductive metal. The spin-torque generation layer 120 may include a tungsten layer 122 and a tungsten-nitride layer 124 sequentially stacked. When the in-plane current IC flows through the spin-torque generation layer 120, the spin-torque generation layer 120 may provide spin current Is in a direction perpendicular to a placement plane (a free layer direction). The spin current Is may generate an SOT using a spin Hall effect (SHE) or a Rashba effect. The SOT may switch magnetization of the free layer 130. Both ends of the spin-torque generation layer 120 may be connected to an external circuit applying in-plane current through connection electrodes 120a and 120b.

The switching current may vary depending on a thickness and a composition of the tungsten-nitride layer 124. In addition, magnetization characteristics of the free layer may vary depending on the thickness and the composition of the tungsten-nitride layer 124. For example, the thickness and the composition of the tungsten-nitride layer 124 may provide perpendicular magnetic anisotropy to the free layer 130 within a predetermined range. When the free layer 140 exhibits perpendicular magnetic anisotropy, switching current may be decreased as the thickness of the tungsten-nitride layer 124 is decreased and a concentration of nitrogen is increased.

Specifically, a thickness of the tungsten-nitride layer 124 may be 0.2 nm, and nitrogen atomic percent in the tungsten-nitride layer 124 may be 5% to 42%. In this case, switching current may be decreased as the nitrogen atomic percent is increased while the free layer 130 may maintain perpendicular magnetic anisotropy. On the other hand, when the atomic percent of nitrogen is greater than 42%, the free layer 130 may lose the perpendicular magnetic anisotropy and may have in-plane magnetic anisotropy.

The nitrogen atomic percent in the tungsten-nitride layer 124 may be 2% to 29%, and the thickness of the tungsten-nitride layer 124 may be 0.2 nm to 0.8 nm. In this case, the free layer 130 may maintain perpendicular magnetic anisotropy.

The nitrogen atomic percent in the tungsten-nitride layer 124 may be 2% to 5%, and the tungsten-nitride layer 124 may have a thickness of 0.2 nm to 3 nm. In this case, the free layer 130 may maintain perpendicular magnetic anisotropy.

The tungsten-nitride layer 124 may include a crystalline $W_2N$ (111) phase. Alternatively, the tungsten-nitride layer 124 may include a crystalline $W_2N$ (111) phase and a crystalline WN (100) phase. In this case, the free layer 130 may maintain perpendicular magnetic anisotropy.

The electrode 160 may be disposed on the pinned layer 150 to be connected to an external circuit.

Figure 3A:
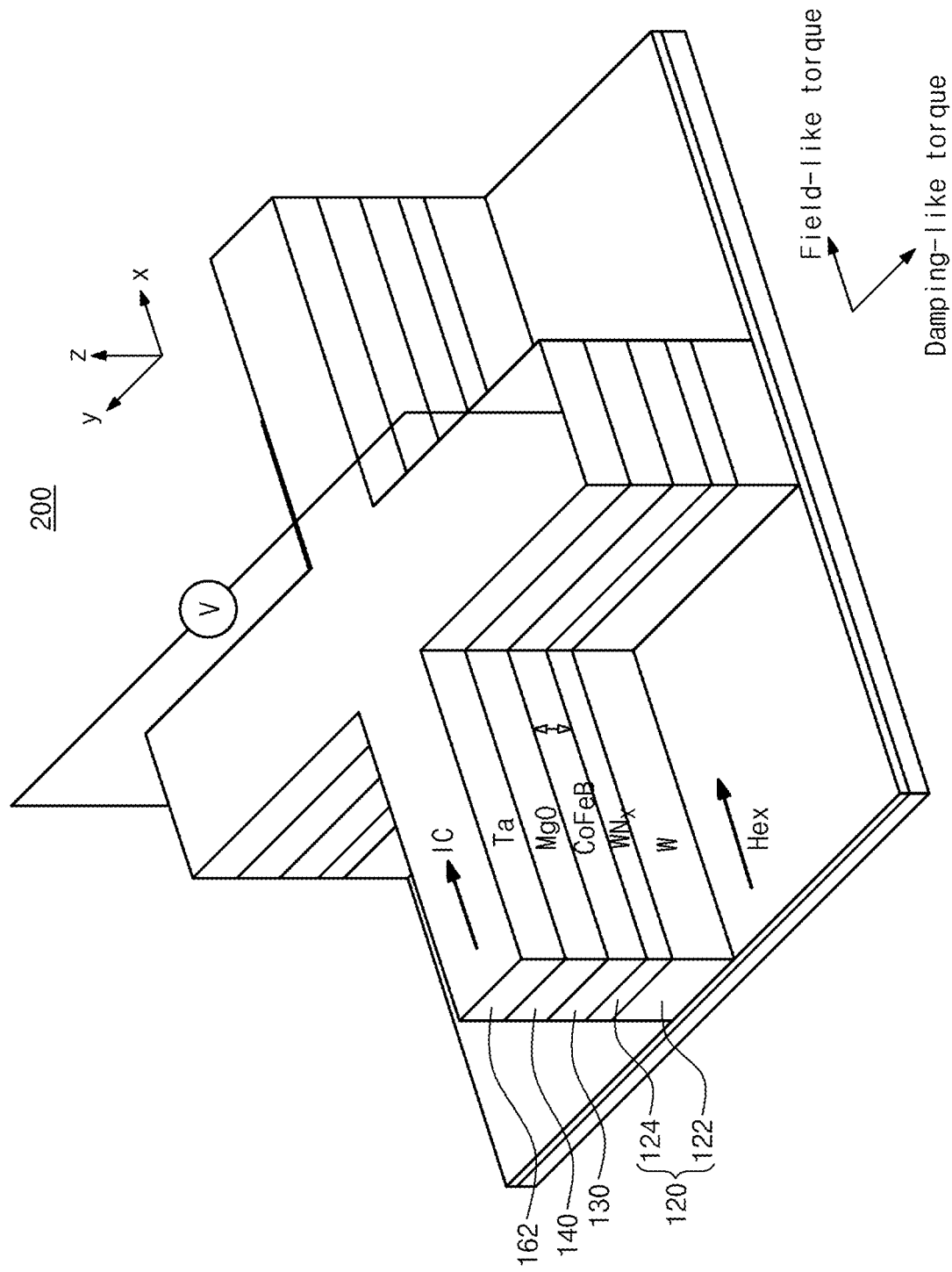
FIG. 3A illustrates a magnetic device according to an example embodiment of the present disclosure.

FIG. 3A illustrates a magnetic device according to an example embodiment of the present disclosure.

Figure 3B:
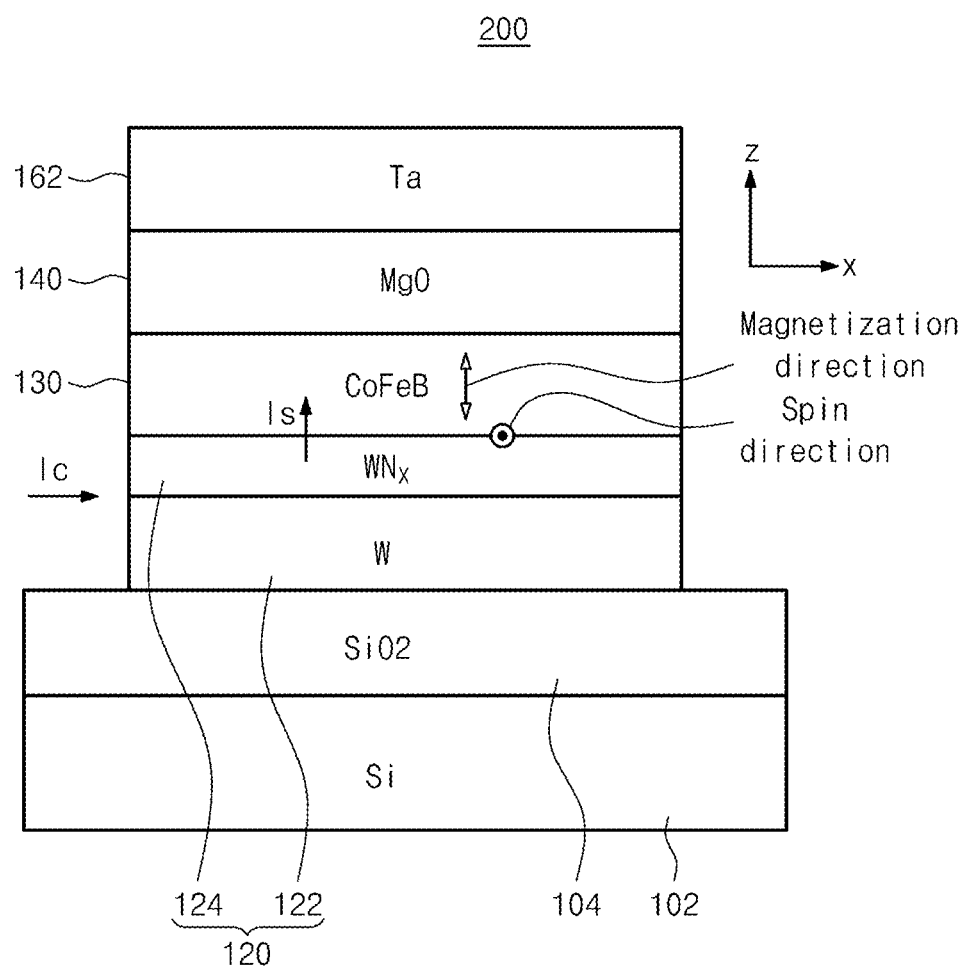
FIG. 3B is a cross-sectional view of FIG. 3A.

FIG. 3B is a cross-sectional view of FIG. 3A.

Referring to FIGS. 3A and 3B, a magnetic device 200 includes a free layer 130 having a switched magnetization direction, a tunnel insulating layer 140 disposed below the free layer 130, and a spin-torque generation layer 120 injecting spin current into the free layer 130 as in-plane current flows. A pinned layer and the free layer 130 may have perpendicular magnetic anisotropy, and the spin-torque generation layer 120 may include a tungsten layer 122 and a tungsten-nitride layer 124 sequentially stacked. The tungsten-nitride layer 124 is disposed adjacent to the free layer 130. A capping layer 162 may be disposed on the tunnel insulating layer 140 to protect the tunnel insulating layer 140. The capping layer 162 may include tantalum.

A spin-orbit torque (SOT) may be caused by a spin Hall effect (SHE) of a nonmagnet NM or a spin-torque generation layer, or a Rashba-Edelstein effect of a nonmagnet/ferromagnet (NM/FM) interface. In a nonmagnet/ferromagnet (NM/FM) structure, when a direction perpendicular to the nonmagnet/ferromagnet (NM/FM) interface is a Z direction and in-plane current Ic is injected into the nonmagnet NM in an X direction, a spin in a Y direction may be accumulated due to the two effects. In this case, the torque caused by the SOT may be expressed by two components of a magnetization direction $\hat{m}$ and a spin direction $\hat{s}$, as follows:

$$\tau_{DL} = \hat{m} \times (\hat{s} \times \hat{m})$$

$$\tau_{FL} = \hat{m} \times \hat{s}$$

where $\tau_{DL}$ is a damping-like (DL) SOT, and $\tau_{FL}$ is field-like (FL) SOT. It is arguable which SOT has a dominant effect on magnetization reversal. However, the present disclosure is aimed at increasing the magnitude of the SOT to reduce switching current.

A ratio of spin current density JS to in-plane current density JC, which may defined as efficiency of an SOT, is referred to as a spin Hall angle SHA ($\xi_{SH} = J_S/J_C$). As the spin Hall angle $\xi_{SH}$ is increased, lower switching current is required to reverse magnetization. In the case of a heavy metal, the spin Hall angle $\xi_{SH}$ is known to be large. The spin Hall angle $\xi_{SH}$ is about 0.33 or less in tungsten (W), about 0.15 or less in tantalum (Ta), and about 0.10 or less in platinum (Pt).

According to an example embodiment, the tungsten-nitride layer 124 was inserted between the nonmagnet NM and the ferromagnet FM and a thickness and a composition of the tungsten-nitride layer 124 were controlled to reduce the switching current. Accordingly, the spin Hall angle $\xi_{SH}$ may be increased to 0.54. In addition, a current-induced SOT switching behavior is decreased to about one-fifth (⅕) of a value in the absence of the tungsten-nitride layer 124. Even in a significantly thin tungsten-nitride layer 124 (0.2 nm), the SOT switching behavior varies depending on the content of nitrogen atoms (N).

According to an example embodiment, an SiO₂ layer 104 having a thickness of 300 nm is deposited on a Si wafer 102. W/WN$_x$/CoFeB/MgO/Ta layers are sequentially stacked on the SiO2 layer 104. A tungsten layer 122 and a tungsten-nitride layer 124 are deposited by a DC magnetron sputtering system.

A DC magnetron sputtering system was used to deposit a metal at initial vacuum of $5 \times 10^{-9}$ Torr. A working pressure is 1.3 mTorr in an argon (Ar) gas atmosphere. The tungsten-nitride layer 124 was deposited by reactive sputtering. A ratio of an injected Ar gas to an injected N₂ gas was controlled at a constant operating pressure. DC power density was fixed to 2.5 W/cm².

An RF magnetron sputtering system was used to deposit the tunnel insulating layer 140 at initial vacuum of $5 \times 10^{-9}$ Torr and an operating pressure of 6 mTorr. The tunnel insulating layer 130 may include MgO. RF power density was fixed to 1.6 W/cm².

A stack structure of the magnetic device is Si/SiO₂/W (5 nm)/WN$_x$ (tW—N)/CoFeB (0.9 nm)/MgO (1 nm)/Ta (2 nm). The thickness (tW—N) of the tungsten-nitride layer 124 changed from 0 to 3 nm, and the composition of the tungsten-nitride layer 124 was adjusted by changing Q from 0 to 50%, where Q is a ratio (Q=[N₂]/[Ar+N₂]) of an N₂ gas flow rate ([N₂]) to an overall gas flow rate ([Ar+N₂]) during sputtering.

The free layer 130 includes CoFeB (0.9 nm). The capping layer 162 was deposited, and all samples were then annealed in a furnace at 300 degrees Celsius for an hour at $10^{-6}$ Torr. The capping layer 162 acts as a protective layer.

After annealing, magnetic characteristics were measured at room temperature using a vibrating sample magnetometer (VSM). To measure the electrical characteristics, a device having a Hall bar structure having a width of 5 μm in and a length of 35 μm is manufactured using photolithography. The SOT efficiency was measured using harmonics measurement. During the measurement, injected alternating current (AC) and a frequency f were fixed to 1 mA and 13.7 Hz, respectively.

Figure 4:
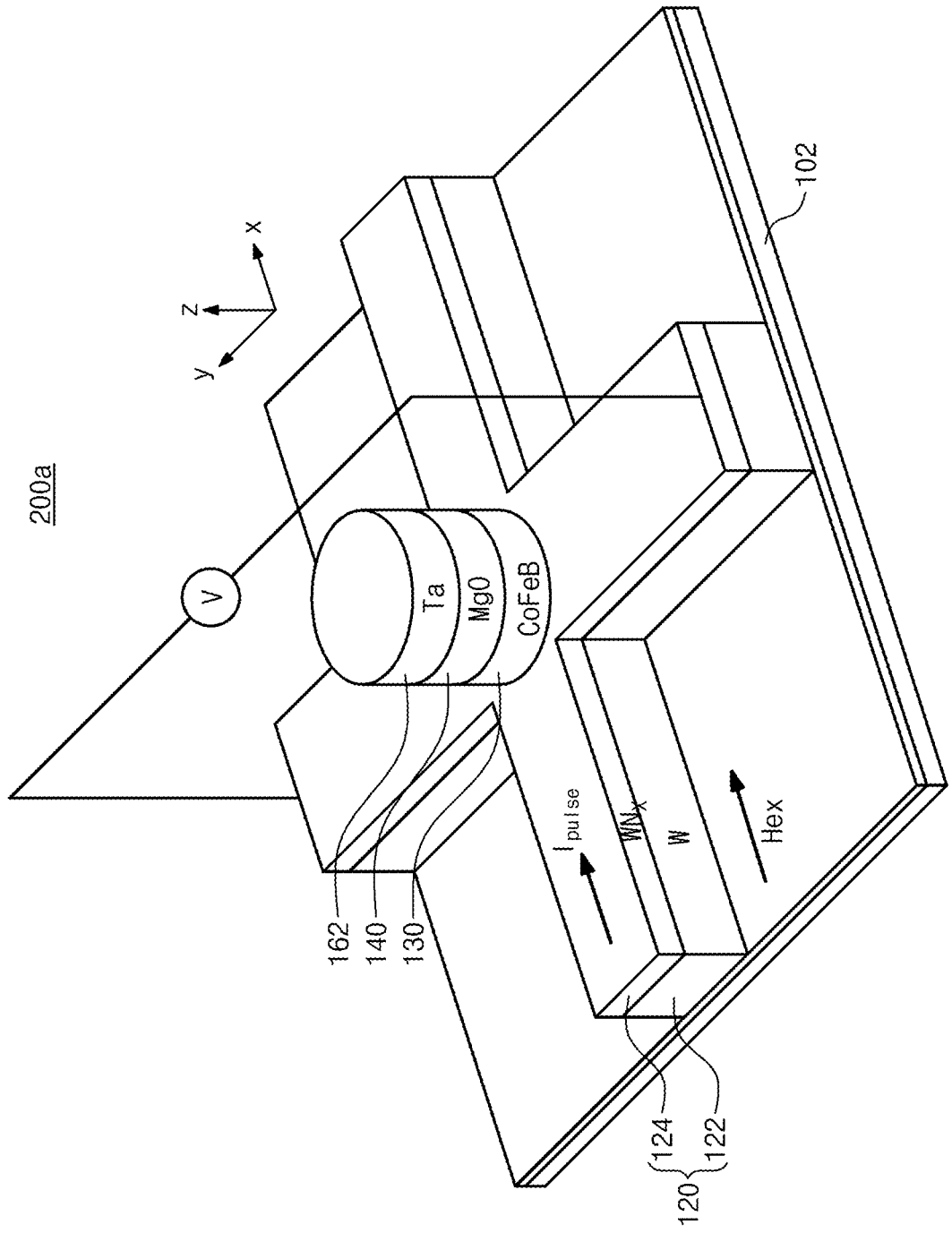
FIG. 4 illustrates a magnetic device for measuring an SOT switching behavior according to an example embodiment of the present disclosure.

FIG. 4 illustrates a magnetic device for measuring an SOT switching behavior according to an example embodiment of the present disclosure.

Referring to FIG. 4, to determine an SOT switching behavior, a dot-shaped pattern having a diameter of 4 μm is formed by successively and anisotropically etching a capping layer 162, a tunnel insulating layer 140, and a free layer 130 in a Hall bar structure. Switching characteristics are measured using a probe station. Pulse current Ipulse, having a pulse width of 10 μs, was applied to the magnetic device in an X direction, and an external magnetic field $H_{ex}$ was applied in an X-axis direction for deterministic switching. A magnetic device 200a may have a dot-shaped free layer 130, a tunnel insulating layer 140, and a capping layer 162 in a Hall bar structure.

Resistance of a tungsten-nitride layer 124 was measured using a four-point probe. Rutherford backscattering (RBS) analysis was performed to confirm a composition of the tungsten-nitride layer 124. A microstructure of the tungsten-nitride layer 124 was analyzed using a grazing incidence X-ray diffraction device at a fixed angle of 0.5 degrees. The microstructure of the tungsten-nitride layer 124 was observed using a transmission electron microscope.

Figure 5:
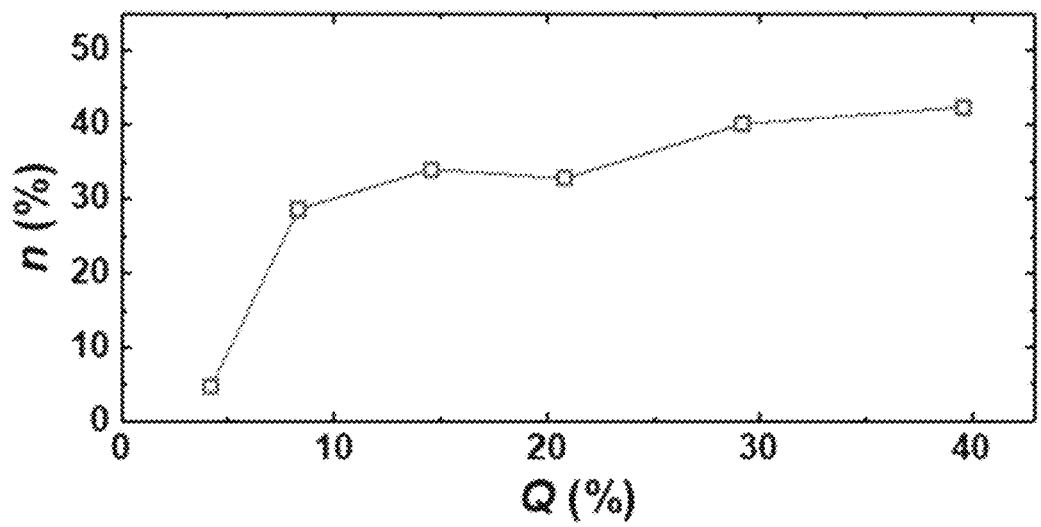
FIG. 5 illustrates nitrogen atomic percent of a tungsten-nitride layer depending on a flow rate Q of a nitrogen ($N_2$) gas according to an example embodiment of the present disclosure.

FIG. 5 illustrates nitrogen atomic percent of a tungsten-nitride layer depending on a flow rate Q of a nitrogen (N₂) gas according to an example embodiment of the present disclosure.

Referring to FIG. 5, Q is a ratio of a flow rate of an N₂ gas ([N₂]) to a total gas flow rate ([Ar+N₂]) during sputtering (Q=[N₂]/[Ar+N₂]). Nitrogen atomic percent of the tungsten-nitride layer 124 was measured by a Rutherford backscattering device.

The content of nitrogen atoms in the tungsten-nitride layer 124 was analyzed. The ratio Q of the flow rate of the N₂ gas is 0, 4, 8, 15, 20, 30, 40, and 50%. Nitrogen atomic percent n is shown as a function of Q of a tungsten nitride thin film having a thickness of 40 nm inspected using Rutherford backscattering (RBS). At Q=4%, the nitrogen atomic percent n is significantly low (5%). At Q=8%, the nitrogen atomic percent n is rapidly increased (29%). At Q=20%, the nitrogen atomic percent n is 33%. However, the nitrogen atomic percent n is rapidly increased again (40%) between Q=20% and Q=30%. At Q=40%, the nitrogen atomic percent n is 42%.

Figure 6:
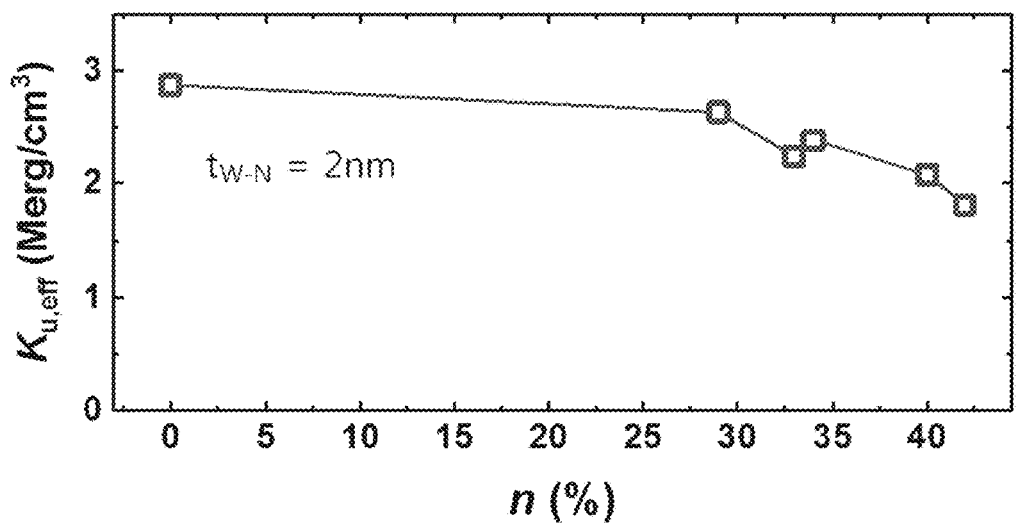
FIG. 6 illustrates effective anisotropic energy $K_{u,eff}$ depending on nitrogen atomic percent n of a tungsten-nitride layer according to an example embodiment of the present disclosure.

FIG. 6 illustrates effective anisotropic energy $K_{u,eff}$ depending on nitrogen atomic percent n of a tungsten-nitride layer according to an example embodiment of the present disclosure.

Referring to FIG. 6, a magnetic device 200 has a structure of W (5 nm)/WN$_x$ (0.2 nm)/CoFeB (0.9 nm)/MgO (1 nm)/Ta (2 nm). Effective anisotropic energy $K_{u,eff}$ depending on the nitrogen atomic percent n of a tungsten-nitride layer 124 was analyzed. The nitrogen atomic percent n of the tungsten-nitride layer 124 was changed in the range of 0 to 42%. The effective anisotropic energy $K_{u,eff}$ is decreased the nitrogen atomic percent n is increased. When a thickness $t_{W-N}$ of the tungsten-nitride layer 124 was fixed to 0.2 nm, perpendicular magnetic anisotropy (PMA) occurred when the nitrogen atomic percent n was within a range of 0% to a maximum of 42%. However, when the nitrogen atomic percent n is greater than 42%, no PMA occurred. The effective anisotropic energy $K_{u,eff}$ was 2.87 Merg/cm³ at n=0% and was decreased to 1.81 Merg/cm³ at n=42%. Accordingly, as the nitrogen atomic percent n was increased, the magnitude of the PMA was decreased. The effective anisotropic energy $K_{u,eff}$ was calculated using areas of in-plane and out-of-plane M-H loops.

Figure 7:
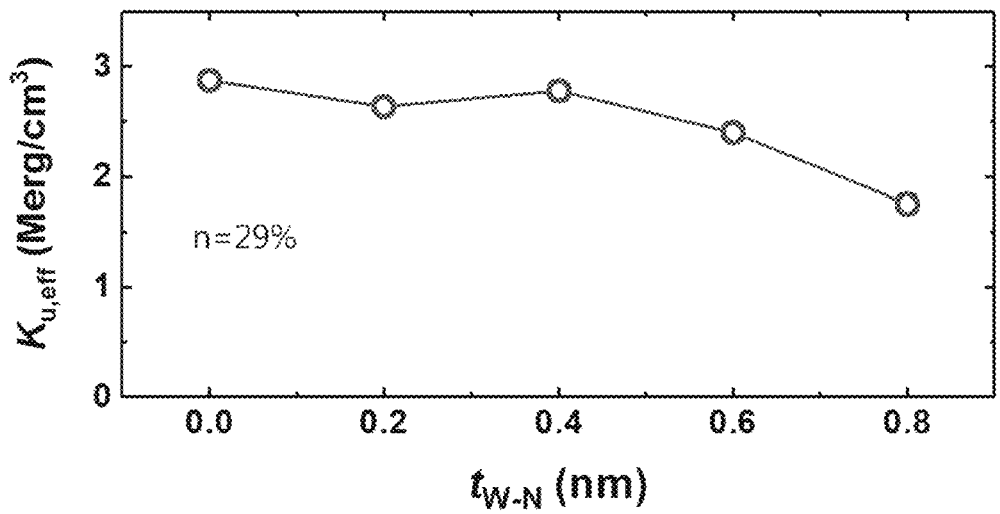
FIG. 7 illustrates effective anisotropic energy $K_{u,eff}$ depending on a thickness $t_{W-N}$ of a tungsten-nitride layer according to an example embodiment of the present disclosure.

FIG. 7 illustrates effective anisotropic energy $K_{u,eff}$ depending on a thickness $t_{W-N}$ of a tungsten-nitride layer according to an example embodiment of the present disclosure.

Referring to FIG. 7, a magnetic device 200 has a structure W (5 nm)/WN$_x$ ($t_{W-N}$)/CoFeB (0.9 nm)/MgO (1 nm)/Ta (2 nm). We changed the thickness $t_{W-N}$ of a tungsten-nitride layer 124 in the range of 0.2 nm to 3 nm.

When the thickness $t_{W-N}$ of the tungsten-nitride layer 124 is greater than or equal to 0.4 nm ($t_{W-N} \geq 0.4$ nm), perpendicular magnetic anisotropy (PMA) was exhibited only when n≤29%. In the case in which the thickness $t_{W-N}$ of the tungsten-nitride layer 124 is greater than 1 nm when n=29%, the PMA disappeared. In the case in which the thickness $t_{W-N}$ of the tungsten-nitride layer 124 is greater than 1.0 nm, the PMA disappeared, irrespective of n.

Since PMA is necessary for a high-density magnetic random access memory (MRAM), we examined an SOT in a structure having a thickness and a composition of the tungsten-nitride layer 124 within the range in which PMA appears. To examine magneto-transport characterization, a magnetic device having PMA was manufactured to have a Hall bar structure having a width of 5 μm and a length of 35 μm using photolithography.

We measured magneto-transport characterization through a harmonic method widely used to evaluate SOT in a PMA magnetic device. When AC current is injected into a magnetic device and the magnetization is in an equilibrium state under an external magnetic field $H_{ex}$, a first harmonic component is expressed using a polar angle θ and an azimuthal angle φ, as follows:

$$R_{xy}^{\omega} = R_{AHE} \cos\theta + R_{PHE} \sin^2\theta \sin 2\varphi \quad \text{Equation 1}$$

where RAHE represents anomalous Hall resistance and RPHE represents planar Hall resistance. A second harmonic component $R_{xy}^{2\omega}$ associated with a thermoelectric voltage is given, as follows:

$$R_{xy}^{2\omega} = [R_{AHE} - 2R_{PHE}\cos\theta \sin 2\varphi] \frac{d\cos\theta}{dB_I} \cdot B_I + \\ R_{PHE}\sin^2\theta \frac{d\sin 2\varphi}{dB_I} \cdot B_I + I_0 \alpha \nabla T \sin\theta \cos\varphi \quad \text{Equation 2}$$

where $I_0$ represents an amplitude of AC current, α represents an abnormal Nernst effect coefficient, and ∇T represents a thermal contribution through Joule heating.

$B_I = B_{DL} + B_{FL} + B_{Oe}$ represents the sum of current-induced fields, where $B_{DL}$ is a damping-like field, $B_{FL}$ is a field-like field, and $B_{Oe}$ is an Oersted field. The fields $B_{DL}$ and $B_{FL}$ are effective magnetic fields generated by DL-SOT and FL-SOT, respectively. Magnetization oscillates in a direction of the effective magnetic field.

In an in-plane magnetization state (θ=π/2), DL-SOT and FL-SOT cause magnetization to vertically and horizontally vibrate in a plane, respectively. Equation 2 may be re-expressed, as follows:

$$R_{xy}^{2\omega} = \left[\left(R_{AHE}\frac{B_{DL}}{B_{ext}} + I_0\alpha\nabla T\right)\cos\varphi + \\ 2R_{PHE}(2\cos^3\varphi - \cos\varphi)\frac{B_{FL}+B_{Oe}}{B_{ext}}\right] \quad \text{Equation 3}$$

When an external magnetic field $B_{ext}$ sufficiently larger than an anisotropic magnetic field $H_K$ is applied, it may assumed that contribution of resistance caused by a thermal gradient is constant in the case in which magnetization is in a plane of a film. A second term of the planar Hall effect disappears when φ=45°. Under the assumption, Equation 3 may be approximated to calculate $B_{DL}$, a valid field generated by DL-SOT. Then $B_{FL} + B_{Oe}$ may be obtained.

$$B_{DL} = \left[R_{DL}^{2\omega} / \cos\varphi \frac{dR_{xy}^W}{d\theta_B}\right]B_{ext}, \quad B_{FL} + B_{Oe} = \left[R_{FL}^{2\omega} / \cos\varphi \frac{dR_{xy}^W}{d\varphi_B}\right]B_{ext} \quad \text{Equation 4}$$

Then, we may calculate SOT efficiency. A spin Hall angle ξ is given, as follows.

$$\xi_{DL(FL)} = 2\frac{e}{\hbar} M_S t_{FM} \frac{B_{DL(FL)}}{J_e} \quad \text{Equation 5}$$

where e represents an electron charge, h represents a Planck constant, $M_S$ represents saturated magnetization of a free layer, $t_{FM}$ represents a thickness of the free layer, and $J_e$ represents current density.

To obtain a spin Hall angle $\xi_{DL}$, we changed a direction of the external magnetic field $B_{ext}$ to perform harmonic measurement. We apply an external magnetic field $B_{ext}$ having about 13 to 18 kOe, twice greater than a value of an anisotropic magnetic field $H_K$ of a magnetic device.

Since FL-SOT efficiency of tungsten is known to be about ten times lower than DL-SOT efficiency, only a spin Hall angle $\xi_{DL}$ formed by the DL-SOT is considered in the present disclosure.

Figure 8:
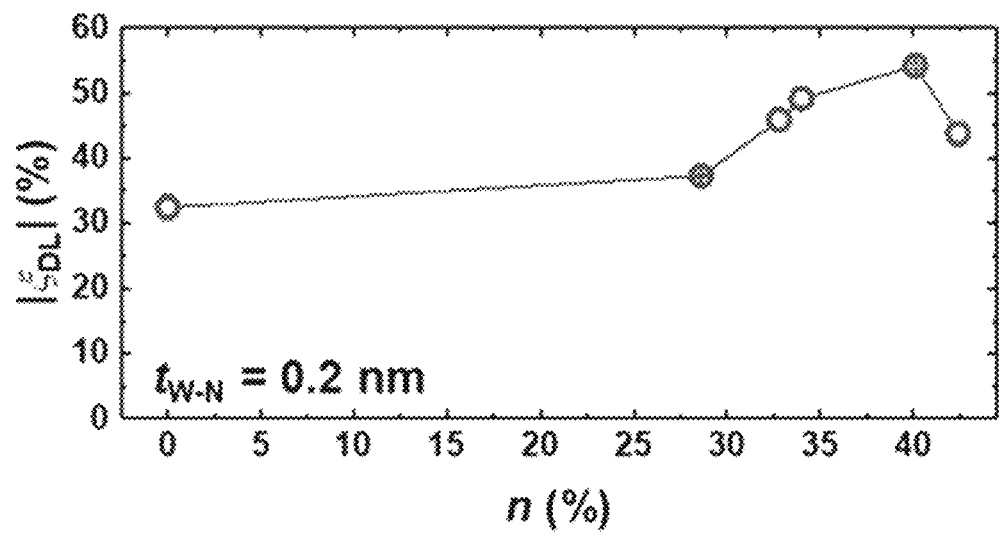
FIG. 8 illustrates an absolute value $|\xi_{DL}|$ of a spin Hall angle depending on nitrogen atomic percentage n according to an example embodiment of the present disclosure.

FIG. 8 illustrates an absolute value $|\xi_{DL}|$ of a spin Hall angle depending on nitrogen atomic percentage n according to an example embodiment of the present disclosure.

Figure 9:
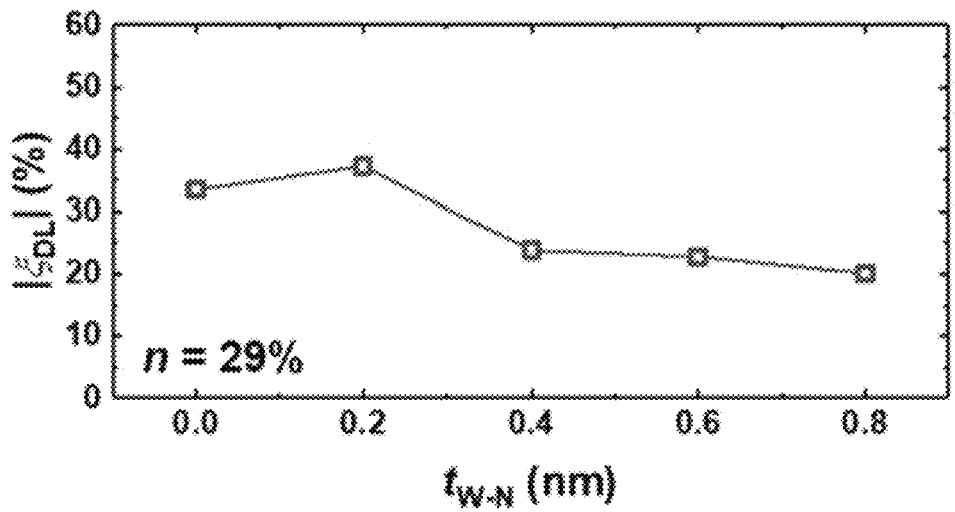
FIG. 9 illustrates an absolute value $|\xi_{DL}|$ of a spin Hall angle depending on a thickness $t_{W-N}$ of a tungsten-nitride layer according to an example embodiment of the present disclosure.

FIG. 9 illustrates an absolute value $|\xi_{DL}|$ of a spin Hall angle depending on a thickness $t_{W-N}$ of a tungsten-nitride layer according to an example embodiment of the present disclosure.

Referring to FIGS. 8 and 9, $|\xi_{DL}|$ is gradually increased as n is increased and reaches a maximum of 0.54 when n=40%. This spin Hall angle is significantly larger than that of tungsten solely. When n>40%, $|\xi_{DL}|$ is slightly decreased.

In a structure of W (5 nm)/CoFeB/MgO structure (n=0%, $t_{W-N}$=0 nm), a W thin film having a thickness of 5 nm is expected to be β-phase W and an absolute value of the spin Hall angle ($|\xi_{DL}|$) is 0.32±0.02.

In a structure W (5 nm)/WN$_x$ ($t_{W-N}$)/CoFeB (0.9 nm)/MgO (1 nm)/Ta (2 nm), $|\xi_{DL}|$ varies depending on $t_{W-N}$ under the condition in which n=29%. When $t_{W-N}$=0.2 nm, $|\xi_{DL}|$ is slightly higher than under the condition in which the tungsten-nitride layer 124 is not provided. However, at a thickness of the tungsten-nitride layer 124 greater than 0.2 nm, $|\xi_{DL}|$ is gradually decreased as $t_{W-N}$ is increased. This result indicates that a significantly thin tungsten-nitride layer 124 may improve SOT characteristics.

However, when $t_{W-N}$ is greater than 0.2 nm, characteristics of a bulk tungsten nitride are gradually exhibited. Therefore, SOT efficiency is lower than that when the tungsten-nitride layer 124 is not provided. Nevertheless, when tW-N is greater than 0.2 nm, critical current for switching is decreased.

Figure 10:
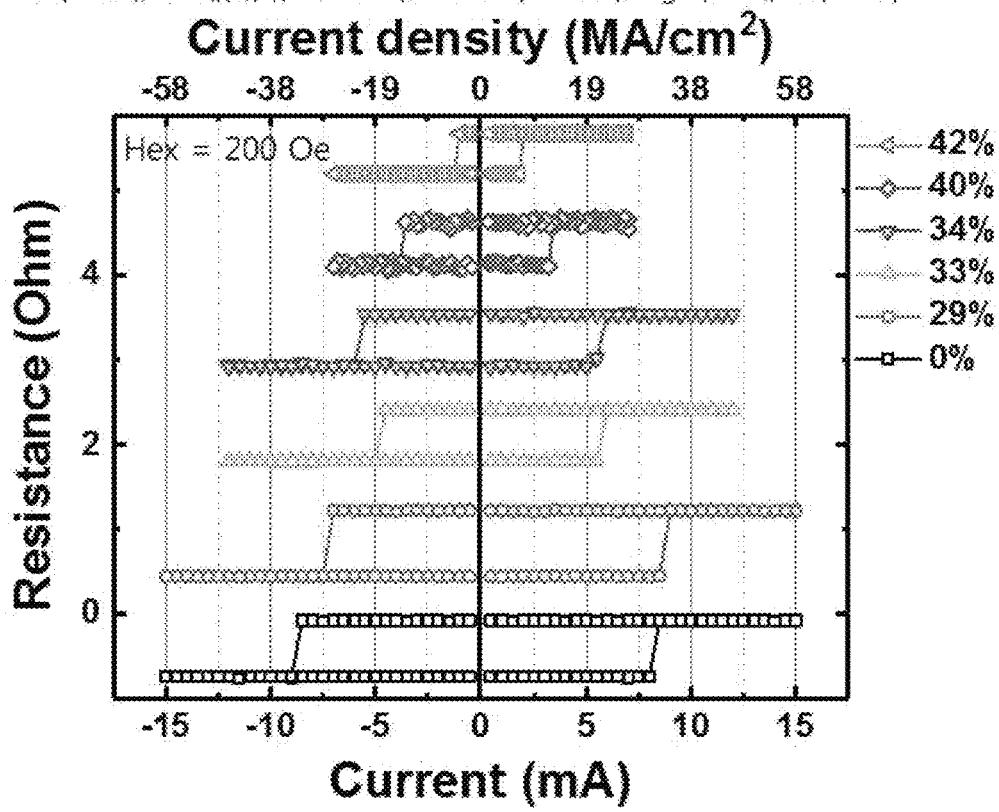
FIG. 10 illustrates resistance depending on current for each condition of n at $t_{W-N}$=0.2 nm.

FIG. 10 illustrates resistance depending on current for each condition of n at $t_{W-N}$=0.2 nm.

Referring to FIG. 10, when an external magnetic field ($H_{ex}$=+200 Oe) is applied to a magnetic device 200a in an X-axis direction, definitive switching of a free layer 130 occurs irrespective of n.

Switching current $I_{SW}$ is decreased as n is increased, and a switching direction is maintained to be constant in a counterclockwise direction as n is changed.

In a structure of W/CoFeB/MgO structure (n=0%) in which a tungsten-nitride layer 124 is not provided, switching current $I_{SW}$ is 8.58±0.08 mA and switching current density $J_{SW}$ is 33.0 MA/cm². The switching current $I_{SW}$ is gradually decreased as n is increased, and is 1.49±0.16 mA when n=40%, and is five times lower than that in a structure in which the tungsten-nitride layer 124 is not provided.

Figure 11:
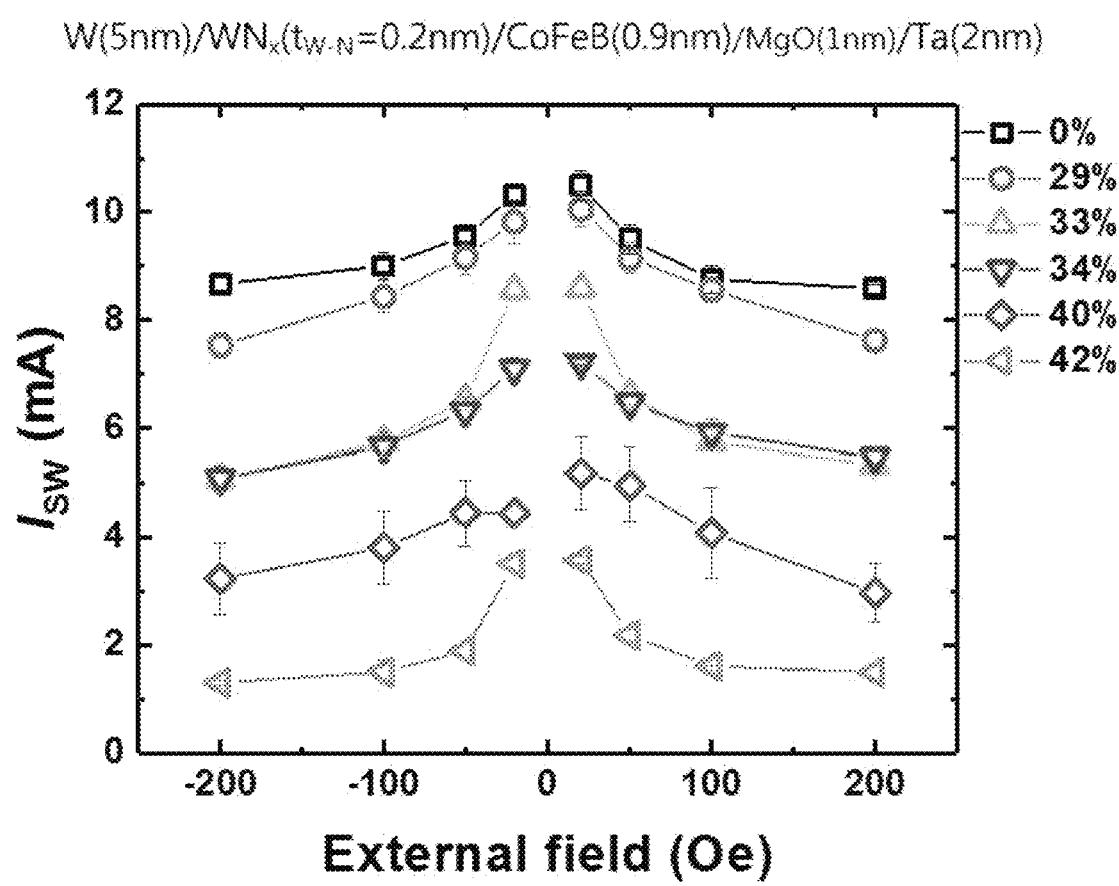
FIG. 11 illustrates switching current depending on an external magnetic field for each condition of n at $t_{W-N}$=0.2 nm.

FIG. 11 illustrates switching current depending on an external magnetic field for each condition of n at $t_{W-N}$=0.2 nm.

Referring to FIG. 11, dependence of a switching operation on an external magnetic field is illustrated. In all nitrogen contents n, switching current $I_{SW}$ tends to be decreased as an external magnetic field $H_{ex}$ is increased. When a direction of the external magnetic field $H_{ex}$ changes from +x to −x, the switching direction is changed in a clockwise direction but the switching current $I_{SW}$ is maintained to be almost the same. This result confirms that an excellent current-induced SOT switching operation is performed. In addition, when the tungsten-nitride layer 124 is applied to an SOT-MRAM, power consumption may be reduced.

Next, a decrease in the switching current $I_{SW}$ may be caused by an increase in $|\xi_{DL}|$. Switching current $I_{SW}^{SO}$, generated by SOT, is expressed as follows:

$$I_{sw}^{SO} = \frac{2e}{\hbar\xi_{SH}} M_S t_{FM} A_{NM} \left( \frac{H_{K,eff}}{2} - \frac{H_{ex}}{\sqrt{2}} \right) \quad \text{Equation 6}$$

where $A_{NM}$ represents a thickness of a nonmagnetic layer (or a spin Hall generating layer) into which current is injected, $H_{K,eff}$ represents an anisotropic magnetic field, $t_{FM}$ represents a thickness of a free layer, $M_S$ represents saturated magnetization of the free layer, and $H_{ex}$ represents an external magnetic field.

In Equation 6, $H_{ex}$ is smaller than $H_{K,eff}$ and is negligible because $M_S H_{K,eff}/2$ is the same as effective anisotropic energy $K_{u,eff}$. Therefore, when $t_{FM}$ and $A_{NM}$ are fixed, the switching current $I_{SW}^{SO}$ generated by SOT is in direct proportion to the effective anisotropic energy $K_{u,eff}$.

Since insertion of the tungsten-nitride layer 124 affects degradation of the effective anisotropic energy $K_{u,eff}$, we examine possibility that the switching current $I_{SW}$ is affected by a decrease in the effective anisotropic energy $K_{u,eff}$.

Figure 12:
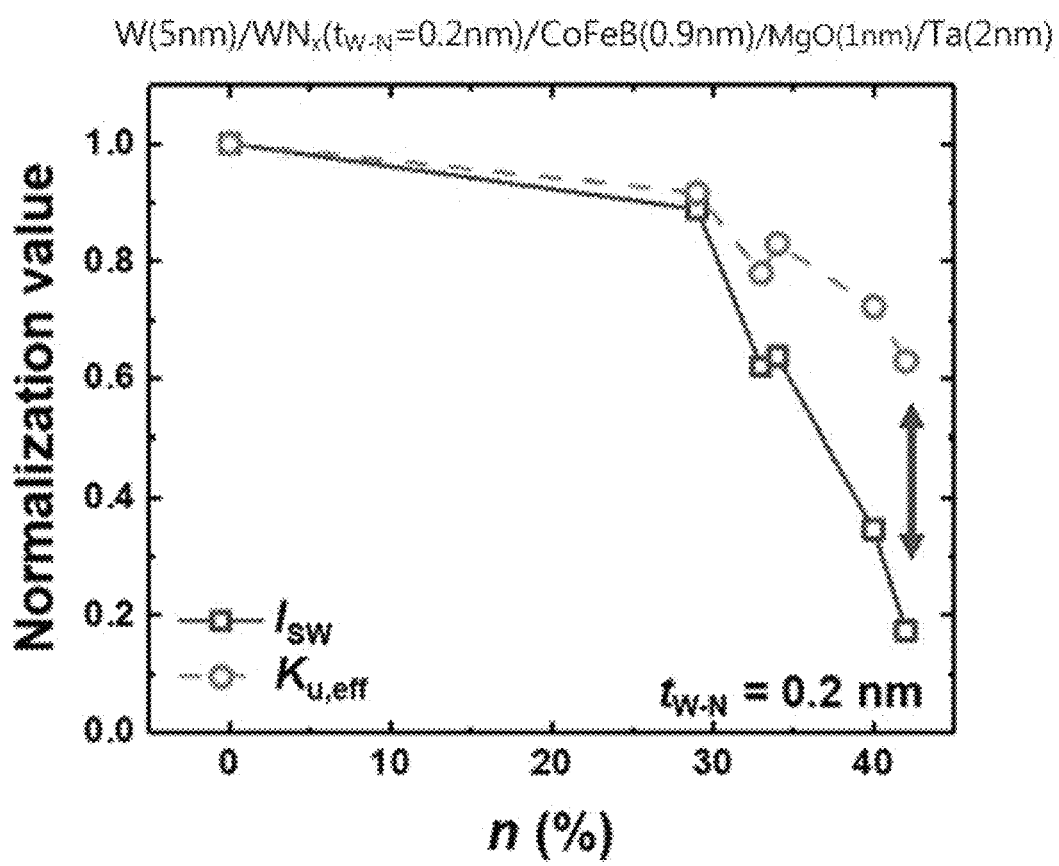
FIG. 12 illustrates normalized switching current and perpendicular magnetic anisotropy depending on n when $t_{W-N}$=0.2 nm.

FIG. 12 illustrates normalized switching current and perpendicular magnetic anisotropy depending on n when $t_{W-N}$=0.2 nm.

Figure 13:
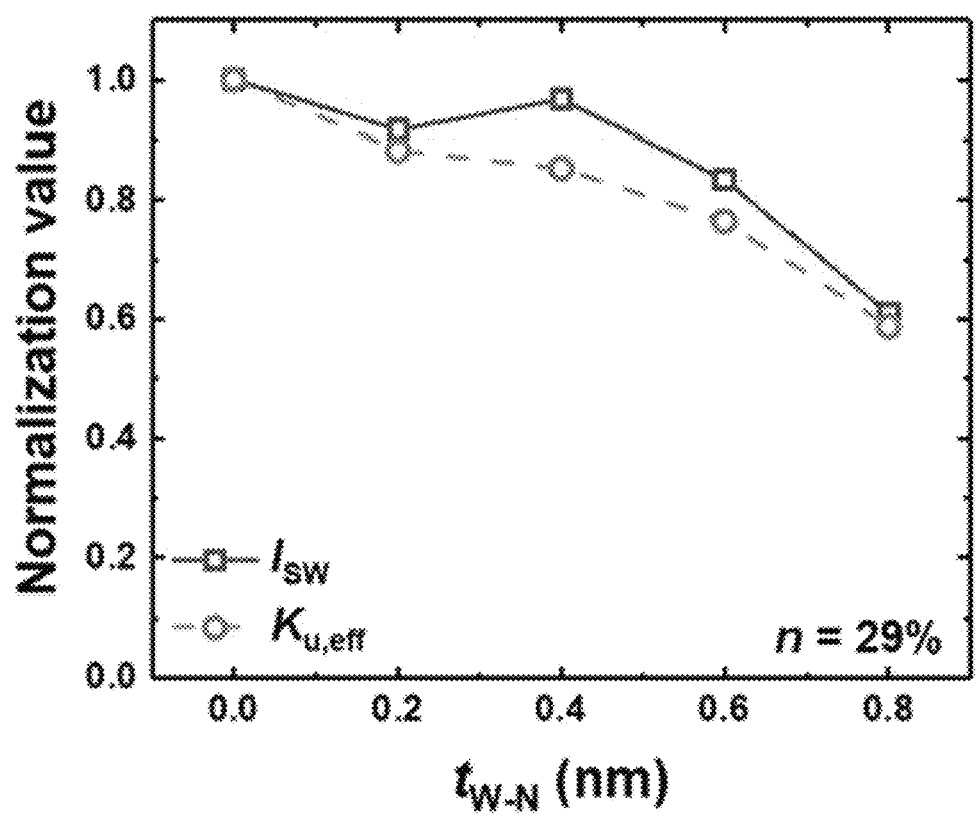
FIG. 13 illustrates normalized switching current and perpendicular magnetic anisotropy depending on n when n=29%.

FIG. 13 illustrates normalized switching current and perpendicular magnetic anisotropy depending on n when n=29%.

Referring to FIGS. 12 and 13, normalized values of $I_{SW}$ and $K_{u,eff}$ are illustrated as functions of n and $t_{W-N}$, respectively.

FIG. 12 shows that the switching current $I_{SW}$ and the effective anisotropic energy $K_{u,eff}$ are decreased as n is increased, but decrease rates thereof are significantly different from each other. From n=34%, the switching current $I_{SW}$ starts to be decreased faster than the effective anisotropic energy $K_{u,eff}$, and a difference therebetween is increased as n is increased.

Returning to FIG. 9, $|\xi_{DL}|$ is decreased as the thickness $t_{W-N}$ of the tungsten-nitride layer 124 is increased. Nevertheless, referring to FIG. 13, the switching current $I_{SW}$ is decreased as the thickness $t_{W-N}$ of the tungsten-nitride layer 124 is increased.

However, as $t_{W-N}$ is changed, $I_{SW}$ tends to be almost the same as a ratio of $K_{u,eff}$, unlike the case in which n is increased. Accordingly, $I_{SW}$ is decreased as $t_{W-N}$ is increased due to the change in $K_{u,eff}$ rather than improvement of SOT efficiency. This result indicates that the decrease in $I_{SW}$ with the increase in n is significantly affected by improved SOT efficiency and the decrease in $K_{u,eff}$. Insertion of a significantly thin tungsten-nitride layer 124 improves SOT switching efficiency. As result, the thin tungsten-nitride layer 124 having nitrogen atomic percent n of about 40% provides significant advantages in terms of power consumption of an SOT-MRAM.

A discussion will be provided about how a composition of the tungsten-nitride layer 124 inserted into an FM/NM interface affects SOT efficiency. Among possible causes of improved efficiency, one cause is a change in electrical resistance because impurities are present. Intrinsic and side-jump scattering, a possible cause of a spin Hall effect (SHE), is associated with resistivity $\rho_{xx}$ of a material.

The impurities of the material may increase scattering and $\rho_{xx}$ values to improve $\xi_{SH}$. We measure $\rho_{xx}$ in a Hall bar device to demonstrate that the improvement of $|\xi_{DL}|$ is due to the increase in $\rho_{xx}$ as n is increased in a W—N layer.

Figure 14:
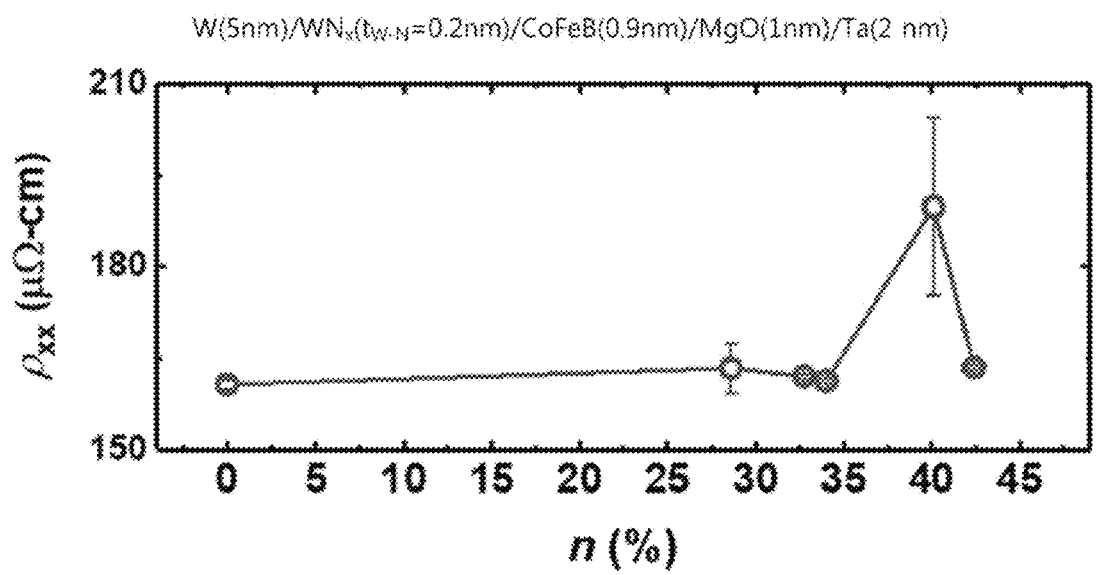
FIG. 14 illustrates resistivity $\rho_{xx}$ as a function of n in a structure of W (5 nm)/$WN_x$ ($t_{W-N}$=0.2 nm)/CoFeB (0.9 nm)/MgO (1 nm)/Ta (2 nm).

FIG. 14 illustrates resistivity $\rho_{xx}$ as a function of n in a structure of W (5 nm)/WN$_x$ ($t_{W-N}$=0.2 nm)/CoFeB (0.9 nm)/MgO (1 nm)/Ta (2 nm).

Referring to FIG. 14, $\rho_{xx}$ is expressed as a function of n when $t_{W-N}$=0.2 nm. A value of $\rho_{xx}$ is almost constant for most n values, but is rapidly increase when n=40%. When n=40%, $|\xi_{DL}|$ is maximal. This result indicates that an effect of resistance on $\xi_{DL}$ is not negligible, but $\xi_{DL}$ is not exactly proportional to resistance of the structure of W/WN$_x$/CoFeB/MgO. Therefore, it is interpreted that SOT efficiency is affected by other factors, rather than the resistance.

Another possible cause is an effect of a microstructure of the tungsten-nitride layer 124, such as crystallinity or phase. To confirm this assumption, we observed a change in microstructure of a W film with an increase in n.

However, it is significantly difficult to analyze a change in microstructure of an ultrathin tungsten nitride film having a thickness of 0.2 nm. Therefore, a tungsten nitride film having a thickness of about 40 nm was analyzed to assume that such a change occurred even in an ultrathin film.

Figure 15:
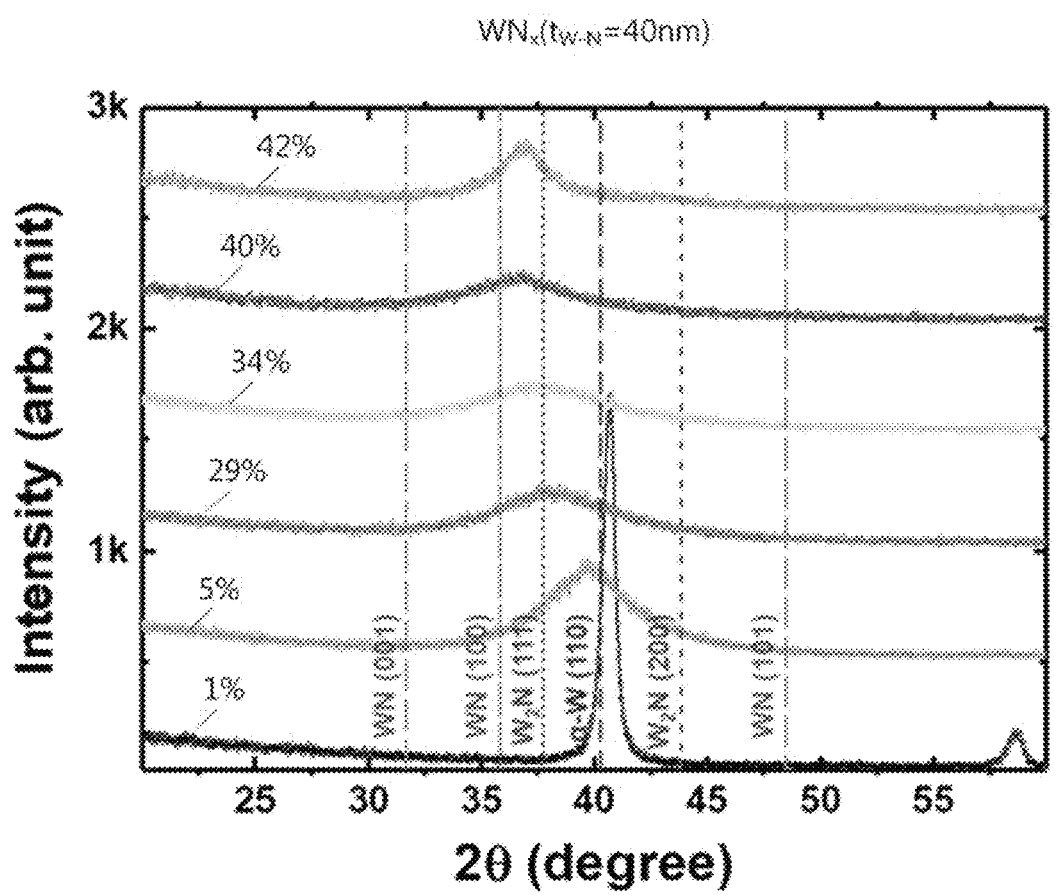
FIG. 15 illustrates a grazing incidence X-ray diffraction (GIXRD) result of a tungsten-nitride layer having a thickness of 40 nm.

FIG. 15 illustrates a grazing incidence X-ray diffraction (GIXRD) result of a tungsten-nitride layer having a thickness of 40 nm.

Referring to FIG. 15, when an N$_2$ gas is not injected during sputtering (n=0%), a W peak clearly appears near 2θ=40 degrees. A W film having a thickness of 5 nm used to measure an SOT is a β-W phase, and a WN$_x$ film having a thickness of 40 nm is an α-W phase. In the WN$_x$ film having a thickness of 40 nm, after n is increased to 5%, a W (110) peak is rapidly decreased, a linewidth is increased, and a peak moves to the left to approach a W$_2$N peak. This result indicates that as n is increased, W$_2$N starts to be formed and crystallinity of W is decreased.

As n is further increased, a linewidth of a peak is further increased and the peak gradually moves to the left to almost match a W$_2$N (111) peak when n=34%. This indicates that when n is greater than 30%, a W phase almost disappears and only a nanocrystalline W$_2$N thin film is present.

When n is greater than 40%, the peak moves further to the left to approach a WN (100) peak. The peak is more clear when n=42%, which indicates that the crystallinity is improved. This result matches a W—N binary phase diagram.

As the content of nitrogen atoms is increased, the steps appear in order, as follows: W→W+W$_2$N→W$_2$N→W$_2$N+WN. W$_2$N appears when n=34% approximately. A phase diagram nearly matches an experimental result.

Then, resistivity of a tungsten nitride film was measured and compared with that reported in the previous research.

Figure 16:
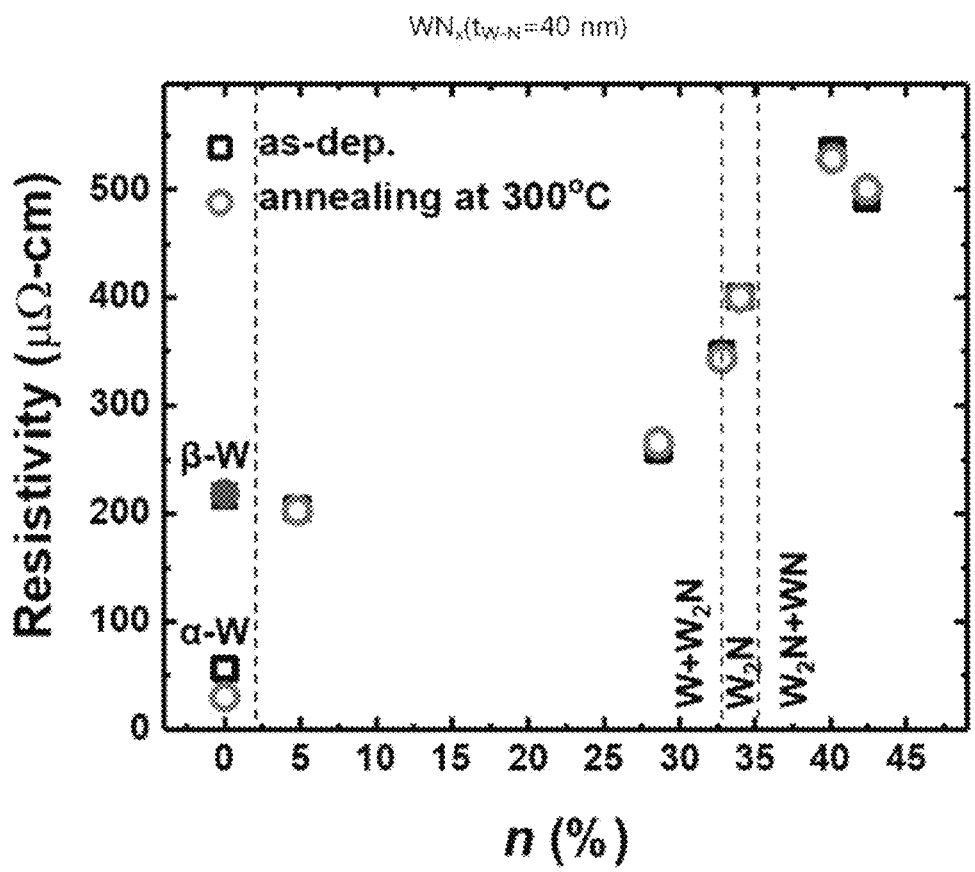
FIG. 16 illustrates resistivity of a tungsten-nitride layer having a thickness of 40 nm as a function of n.

FIG. 16 illustrates resistivity of a tungsten-nitride layer having a thickness of 40 nm as a function of n.

Referring to FIG. 16, dotted lines indicate boundaries of a tungsten nitride phase change predicted by XRD analysis. Resistivity of a tungsten-nitride layer is maintained at 200 to 260 μΩ·cm until n=29%, but is rapidly increased to 350 μΩ·cm or more when n>30%.

When n is greater than 40%, the resistivity is rapidly increased again to 500 μΩ·cm or more. Resistance of a sputtered tungsten-nitride layer is significantly dependent on deposition conditions such as pressure, sputtering power, and temperature. However, in general, as a ratio Q of an $N_2$ gas flow rate ($[N_2]$) to a total gas flow rate ($[Ar+N_2]$) is increased, the resistivity is increased. In addition, as the crystallinity is increased, the resistivity is decreased. This matches our experimental result.

The experimental result indicates that the resistivity is increased until n=40% and is then slightly decreased as the crystallinity is increased when n=42%.

Since peak intensity was too low to stably index a phase using XRD, we analyze a tungsten-nitride layer having a thickness of 40 nm using a transmission electron microscope (TEM), in addition to XRD analysis, because it appears to be nanocrystalline.

Figure 17:
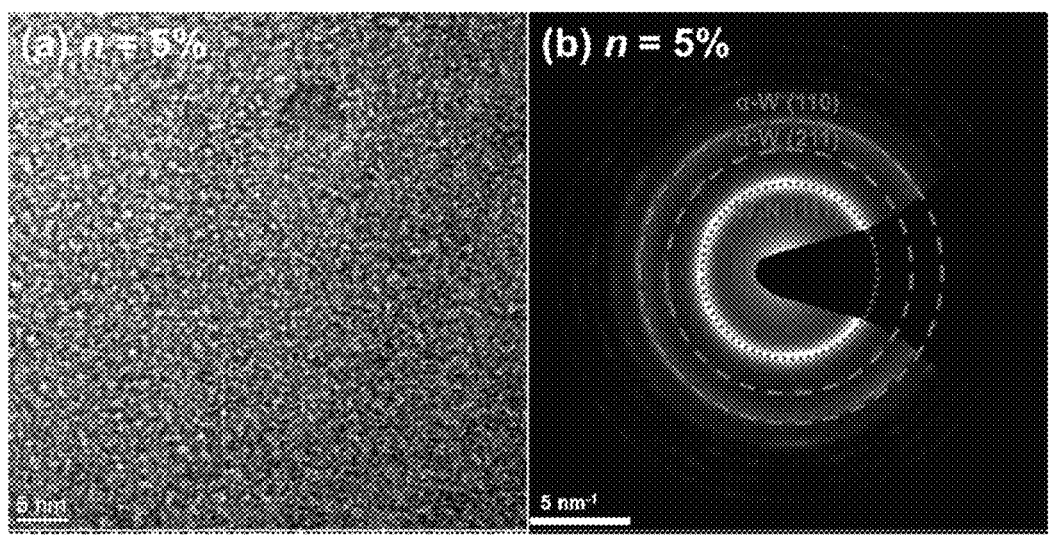
FIG. 17 illustrates in-plane TEM images and selected area diffraction (SAD) patterns when n=5%.

FIG. 17 illustrates in-plane TEM images and selected area diffraction (SAD) patterns when n=5%.

Referring to FIG. 17, when n=5%, polycrystalline grains appear in a nanocrystalline matrix.

When n=5%, the SAD pattern indicates that W and $W_2N$ coexist. Internal dotted circles denote $W_2N$ (111) grains. The $W_2N$ (111) grains are identified by applying a mask to a ring pattern indexed as $W_2N$ (111) in a fast Fourier transform image.

The polycrystalline grains are $W_2N$, which indicates that a W thin film is almost nanocrystalline when nitrogen is injected.

Figure 18:
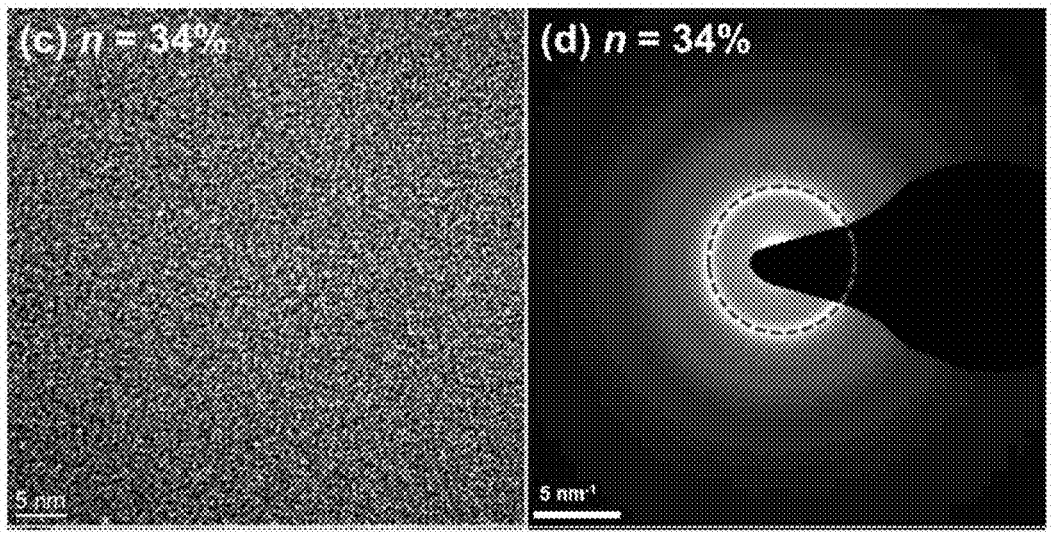
FIG. 18 illustrates in-plane TEM images and selected area diffraction (SAD) patterns when n=34%.

FIG. 18 illustrates in-plane TEM images and selected area diffraction (SAD) patterns when n=34%.

Referring to FIG. 18, TEM and SAD images, each having a clear ring pattern, indicate that only nanocrystalline $W_2N$ (111) is present when n=34%.

Figure 19:
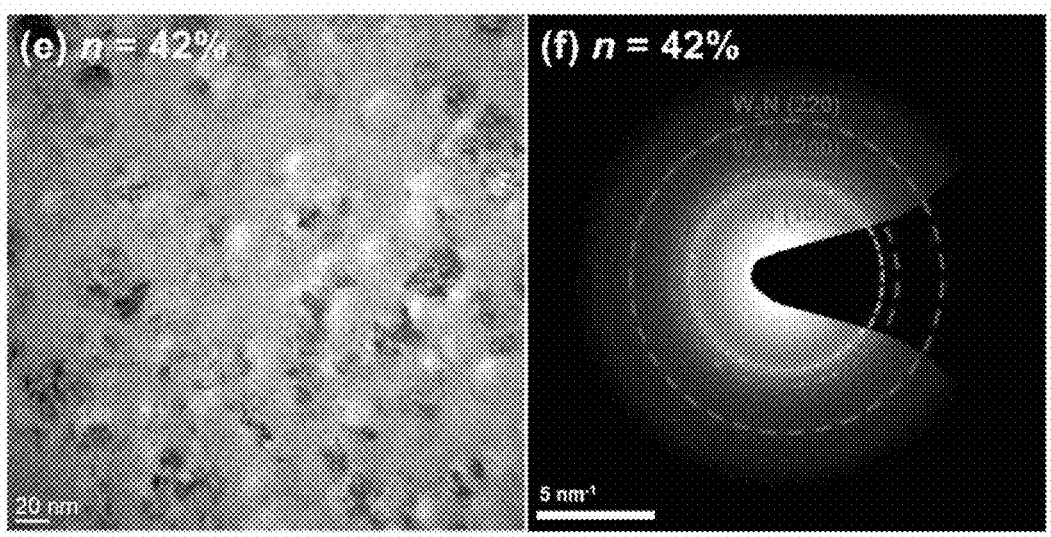
FIG. 19 illustrates in-plane TEM images and selected area diffraction (SAD) patterns when n=42%.

FIG. 19 illustrates in-plane TEM images and selected area diffraction (SAD) patterns when n=42%.

Referring to FIG. 19, when n=42%, different grains are formed in a nanocrystalline matrix. WN (100) appears in the SAD pattern. Therefore, XRD and TEM results match each other and confirm that a phase of a $WN_x$ thin film depends on n.

We examined an effect of n on insertion of a tungsten-nitride layer to find out a cause of an improved SOT effect.

Referring to FIGS. 14 and 16, a resistivity ($\rho_{xx}$) value of a magnetic device and resistivity of a tungsten nitride film having a thickness of 40 nm are slightly different from each other. However, both the resistivity ($\rho_{xx}$) value of the magnetic device and the resistivity of the tungsten nitride film having a thickness of 40 nm show a maximum value when n=40%.

In the magnetic device of FIG. 14, a tungsten-nitride layer having a thickness of 0.2 nm is significantly thin, as compared with the overall thickness of the other films. Therefore, an effect of the tungsten-nitride layer having a thickness of 0.2 nm on resistivity may not be dominant.

Although it may be difficult to apply microstructure analysis to an ultrathin film with complete accuracy, a value of n is expected to affect a microstructure of the tungsten-nitride layer.

Changes of a microstructure, such as changes in phase and crystallinity, accompany a change in resistivity. Therefore, it may difficult to additionally consider the resistivity and the microstructure.

When the content of nitrogen in the tungsten-nitride layer is adjusted, is increased and $I_{SW}$ is decreased. However, there is a need for additional research into the physical origin of an improved SOT switching operation depending on the tungsten-nitride layer.

A discussion will be provided about magnetic device temperature stability at low temperature and high temperature to confirm appropriateness of a structure of $W/WN_x$ ($t_{W-N}$=0.4 nm)/CoFeB/MgO to an MRAM application.

To determine temperature dependence of switching current, an experiment was performed in a device, having $t_{W-N}$=0.4 nm and n=29% changing the temperature, in the following order.

(1) Room Temperature (RT)→(2) −100° C.→(3) RT→(4)+100° C.→(5) RT.

Figure 20:
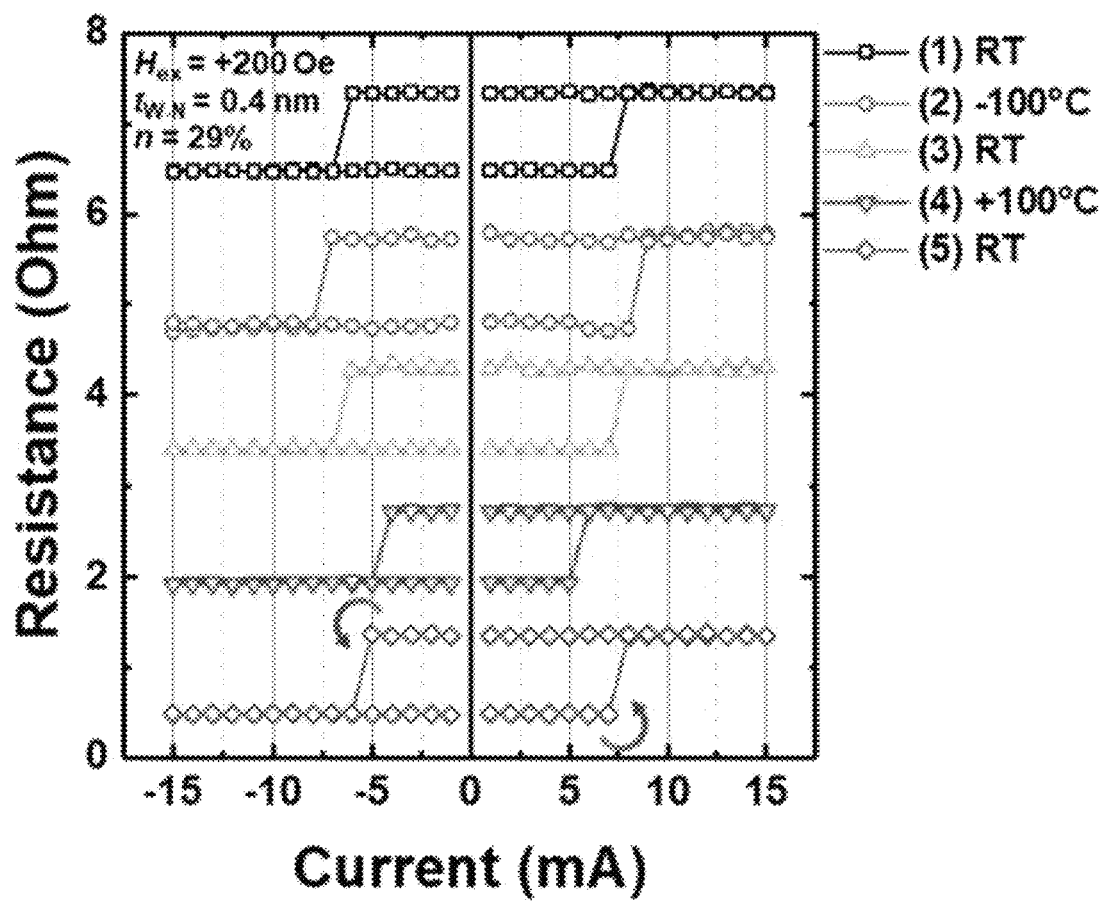
FIG. 20 illustrates resistance depending on in-plane currents at various temperatures under an external magnetic field $H_{ex}$ of +200 Oe.

FIG. 20 illustrates resistance depending on in-plane currents at various temperatures under an external magnetic field $H_{ex}$ of +200 Oe.

Referring to FIG. 20, spin-orbit torque (SOT) switching is performed well in a counterclockwise direction at all temperatures.

Figure 21:
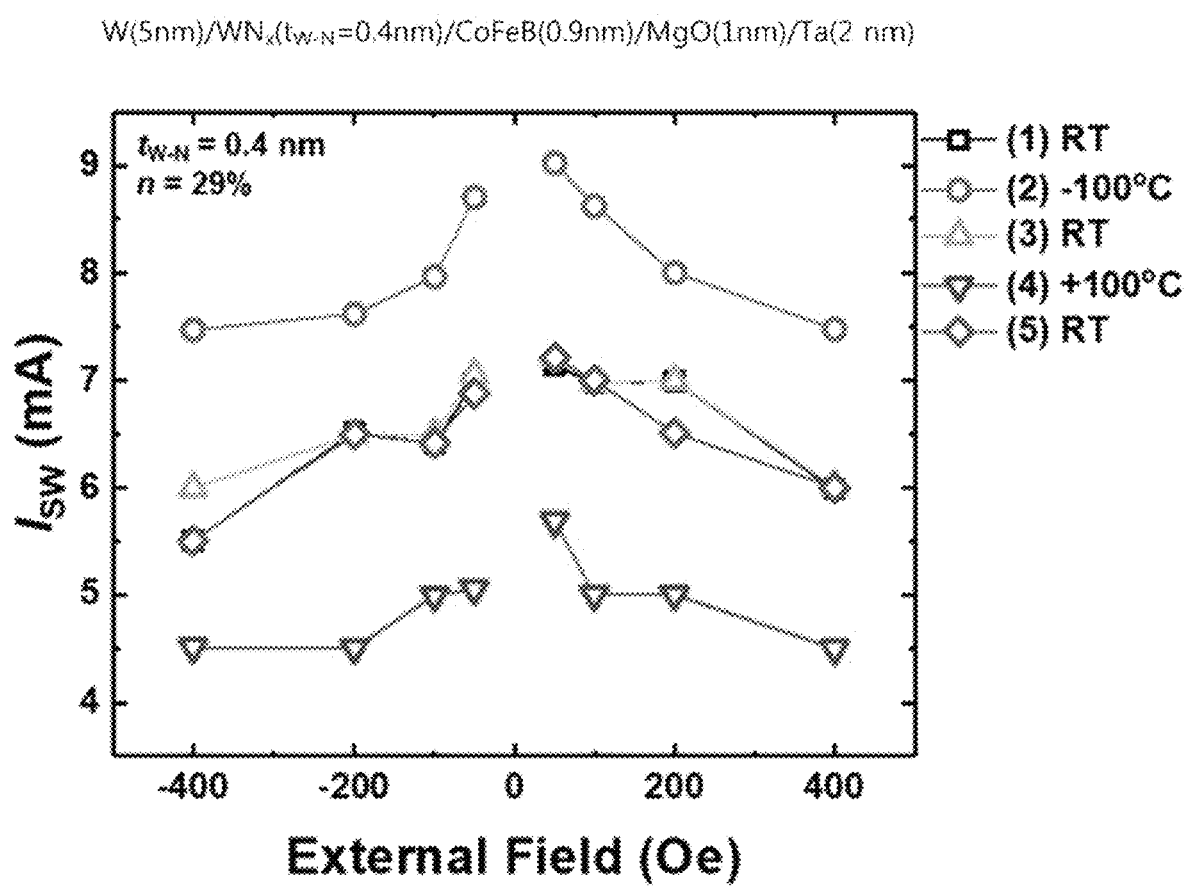
FIG. 21 illustrates switching currents depending on an external magnetic field at various temperatures.

FIG. 21 illustrates switching currents depending on an external magnetic field at various temperatures.

Referring to FIG. 21, when temperature decreases from (1) room temperature (RT) to (2) −100° C., switching current is increased. As the temperature increases from (3) room temperature (RT) to (4) +100° C., the switching current is decreased. It is well known in the art that SOT-induced switching current is decreased at high temperatures, rather than at low temperature, due to thermal fluctuation. However, the switching current is maintained to be constant in (1) an initial room-temperature state, (3) a room-temperature state after cooling, and (5) a room-temperature state after heating. This result confirms that the device may operate in harsh environments of various temperatures and may normally operate without changing operating current even after experiencing low and high temperature environments. Therefore, this means that a structure using a $WN_x$ layer is appropriate to an SOT-MRAM application.

We investigated improvement of an SOT and a decrease in SOT-induced switching current by interface engineering of a structure of $W/WN_x$/CoFeB/MgO including a tungsten-nitride layer. When the content of nitrogen in the tungsten-nitride layer was increased to 40%, we observed high SOT efficiency of 0.54 and a decrease in the switching current by about one-fifth (⅕) of a value of a structure of W/CoFeB/MgO.

A microstructure of a film having various contents of nitrogen was analyzed through XRD and TEM. A result of the analysis found out that the improvement of the SOT may be caused by not only resistivity depending on a composition of the tungsten-nitride layer but also a change of the microstructure (when tungsten changes into $W_2N$ and WN phases).

Figure 22:
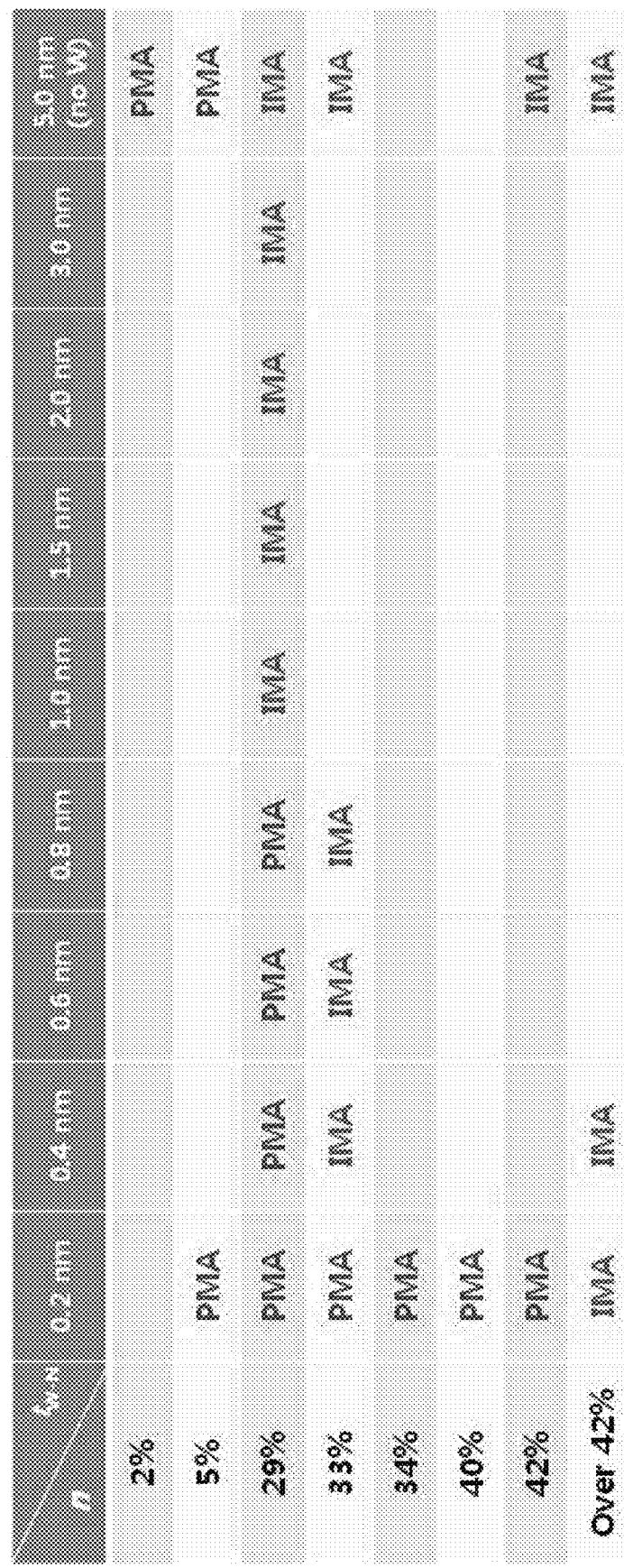
FIG. 22 illustrates an experimental result depending on a nitrogen content n and a thickness of $WN_x$ in a structure of W (5 nm)/$WN_x$ ($t_{W-N}$; n)/CoFeB (0.9 nm)/MgO (1 nm)/Ta (2 nm) according to an example embodiment of the present disclosure.

FIG. 22 illustrates an experimental result depending on a nitrogen content n and a thickness of $WN_x$ in a structure of W (5 nm)/$WN_x$ ($t_{W-n}$; n)/CoFeB (0.9 nm)/MgO (1 nm)/Ta (2 nm) according to an example embodiment of the present disclosure.

Referring to FIG. 22, PMA represents perpendicular magnetic anisotropy and IMA represents in-plane anisotropy. Nitrogen atomic percent of the $WN_x$ layer may be 2% to 29%, and a thickness of the $WN_x$ layer may be 0.2 nm to 0.8 nm. In this case, a free layer (CoFeB (0.9 nm)) may maintain perpendicular magnetic anisotropy.

Nitrogen atomic percent of the $WN_x$ layer may be 2% to 5%, and a thickness of the $WN_x$ layer may be 0.2 nm to 3 nm. In this case, the free layer (CoFeB (0.9 nm)) may maintain perpendicular magnetic anisotropy.

The $WN_x$ layer may include a crystalline $W_2N$ (111) phase. Alternatively, the $WN_x$ layer may include a crystalline $W_2N$ (111) phase and a crystalline WN (100) phase. In this case, the free layer (CoFeB (0.9 nm)) may maintain perpendicular magnetic anisotropy.

In the case of a magnetic device including only a $WN_x$ layer having a thickness of 5 nm without a W layer, a free layer exhibits perpendicular magnetic anisotropy only when the content of nitrogen (n) is 2% to 5%.

Figure 23:
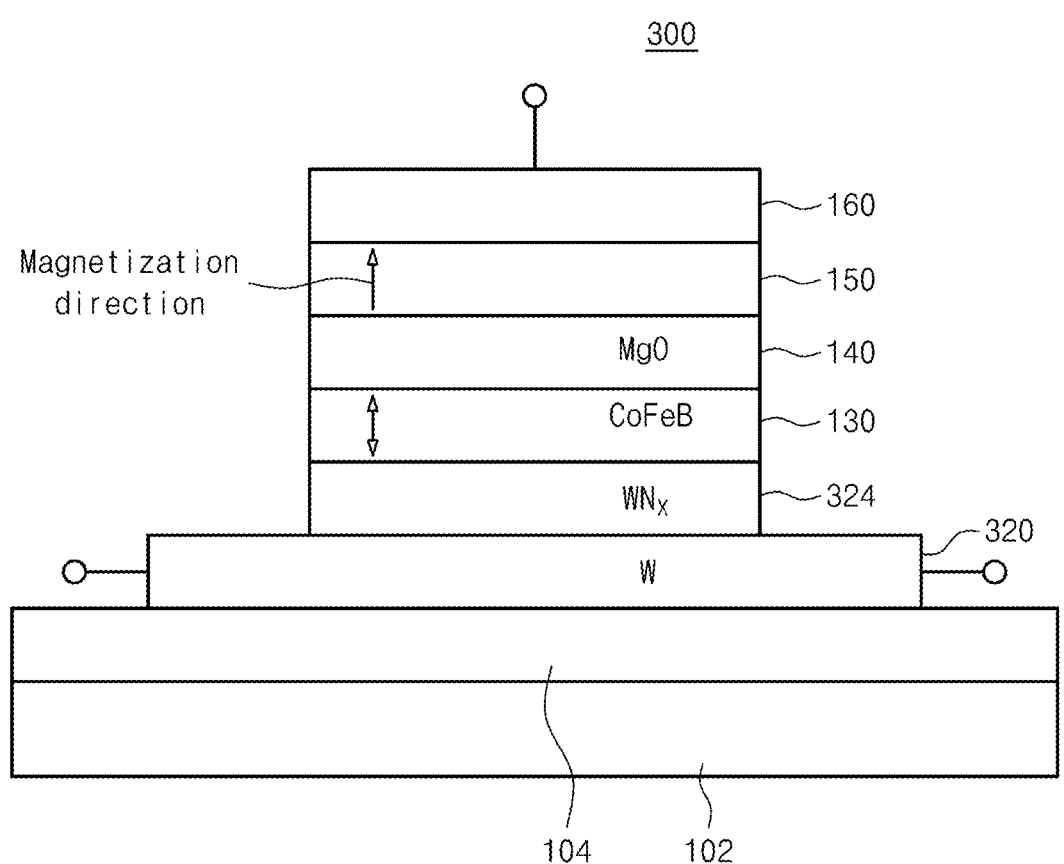
FIG. 23 is a cross-sectional view of a magnetic device according to another example embodiment of the present disclosure.

FIG. 23 is a cross-sectional view of a magnetic device according to another example embodiment of the present disclosure.

Referring to FIG. 23, a magnetic device 300 includes a pinned layer 150 having a fixed magnetization direction, a free layer 130 having a switched magnetization direction, a tunnel insulating layer 140 interposed between the pinned layer 150 and the free layer 130, a spin-torque generation layer 320 injecting spin current into the free layer 130 as an in-plane current flows, and a tungsten-nitride layer 324 disposed between the free layer 130 and the spin-torque generation layer 320. The spin current allows a magnetization direction of the free layer 130 to be switched by a spin-orbit torque. The pinned layer 150 and the free layer 130 have perpendicular magnetic anisotropy, the spin-torque generation layer 320 includes a tungsten layer, and the tungsten-nitride layer 324 is vertically aligned with the free layer 130.

Switching current may vary depending on a thickness and a composition of the tungsten-nitride layer 324. In addition, magnetization characteristics of the free layer 130 may vary depending on the thickness and the composition of the tungsten-nitride layer 324. For example, the thickness and the composition of the tungsten-nitride layer 324 may provide perpendicular magnetization anisotropy to the free layer 130 within a predetermined range. When the free layer 140 exhibits the perpendicular magnetic anisotropy, the switching current may be decreased as the thickness of the tungsten-nitride layer 324 is decreased and a concentration of nitrogen is increased.

Specifically, the thickness of the tungsten-nitride layer 324 may be 0.2 nm, and the nitrogen atomic percent of the tungsten-nitride layer 324 may be 5% to 42%. In this case, the free layer 130 maintains perpendicular magnetic anisotropy and the switching current may be decreased as the nitrogen atomic percent is increased. On the other hand, when the nitrogen atomic percent is greater than 42%, the free layer 130 loses the perpendicular magnetic anisotropy and has in-plane magnetic anisotropy.

The nitrogen atomic percent of the tungsten-nitride layer 324 may be 2% to 29%, and the thickness of the tungsten-nitride layer 324 may be 0.2 nm to 0.8 nm. In this case, the free layer 130 may maintain the perpendicular magnetic anisotropy.

The nitrogen atomic percent of the tungsten-nitride layer 324 may be 2% to 5%, and the thickness of the tungsten-nitride layer may be 0.2 nm to 3 nm. In this case, the free layer 130 may maintain the perpendicular magnetic anisotropy.

The tungsten-nitride layer 324 may include a crystalline $W_2N$ (111) phase. Alternatively, the tungsten-nitride layer 324 may include a crystalline $W_2N$ (111) phase and a crystalline WN (100) phase. In this case, the free layer 130 may maintain the perpendicular magnetic anisotropy.

Both ends of the spin-torque generation layer 320 may be connected to an external circuit applying in-plane current.

Figure 24:
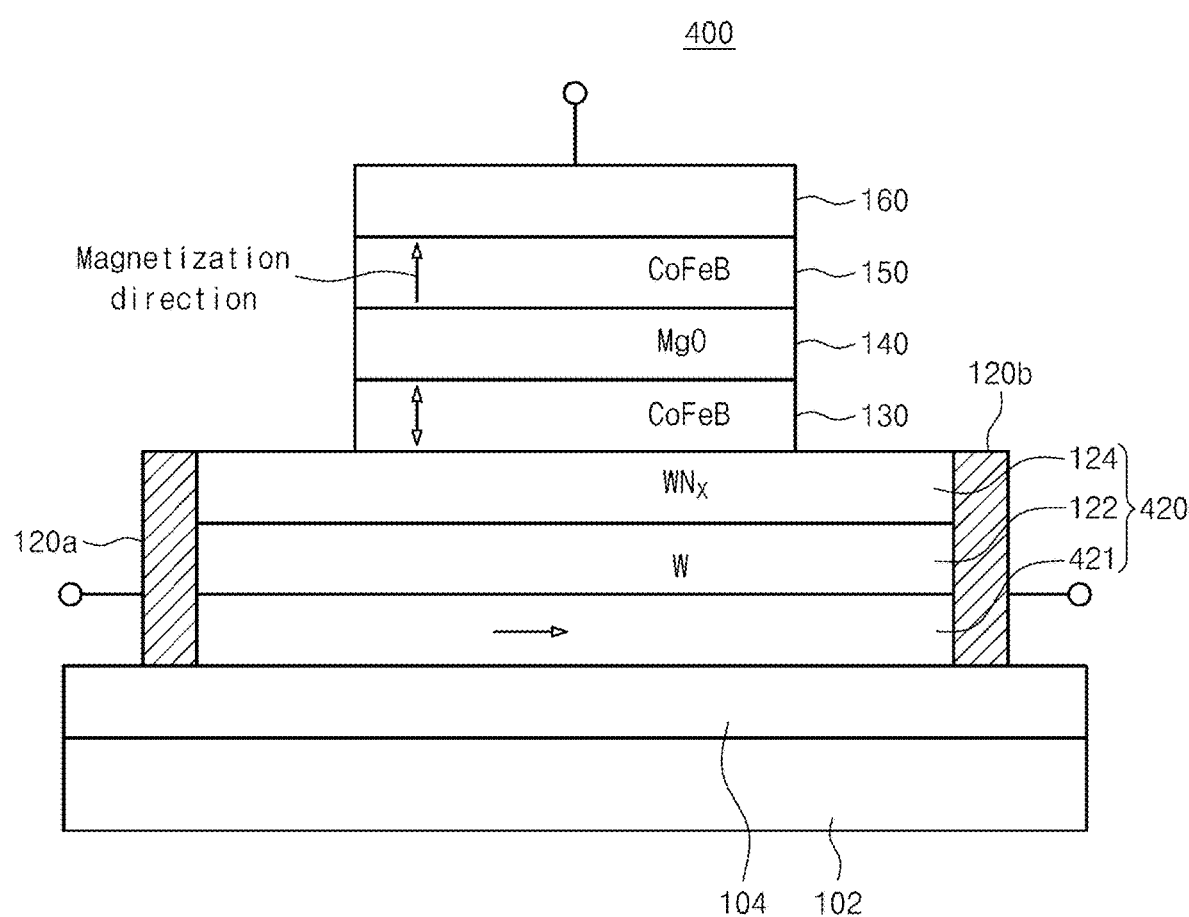
FIG. 24 is a cross-sectional view of a magnetic device according to another example embodiment of the present disclosure.

FIG. 24 is a cross-sectional view of a magnetic device according to another example embodiment of the present disclosure.

Referring to FIG. 24, a magnetic device 400 includes a pinned layer 150 having a fixed magnetization direction, a free layer 130 having a switched magnetization direction, a tunnel insulating layer 140 interposed between the pinned layer 150 and the free layer 130, and a spin-torque generation layer 420 injecting spin current into the free layer 130 as in-plane current flows. The spin current allows a magnetization direction of the free layer 130 to be switched by a spin-orbit torque. The pinned layer 150 and the free layer 130 have perpendicular magnetic anisotropy, and the spin-torque generation layer 420 includes a tungsten layer 122 and a tungsten-nitride layer 124 sequentially stacked. The tungsten-nitride layer 124 may be disposed adjacent to the free layer 130.

The spin-torque generation layer 420 may further include a ferromagnetic layer 421 having in-plane magnetic anisotropy. The tungsten layer 122 may be disposed between the ferromagnetic layer 421 and the tungsten-nitride layer 124. A magnetization direction of the ferromagnetic layer 421 may be parallel or antiparallel to a direction in which the in-plane current flows. Interface generation spin current may be generated between the ferromagnetic layer 421 and the tungsten layer 122. The interface generation spin current may have spin polarization of a z-axis component. Accordingly, spin-orbit torque switching may be implemented without an in-plane external magnetic field.

Both ends of the spin-torque generation layer 420 may be connected to an external circuit applying in-plane current through connection electrodes 120a and 120b.

As described above, according to an example embodiment, an SOT switching device using a tungsten/tungsten-nitride multilayer structure may operate at write current lower than that of a conventional device using a single tungsten layer.

According to an example embodiment, when a spin-torque generation layer which is in contact with a free layer to provide in-plane current includes a tungsten layer/a tungsten-nitride layer, a spin-orbit torque effect of an SOT-MRAM is improved and switching threshold current for a write operation is decreased.

According to an example embodiment, an SOT-MRAM operates in low and high temperature harsh environments, and then normally operates even after the temperature returns to room temperature.

According to an example embodiment, am in-plane magnetization ferromagnet/tungsten/tungsten-nitride multilayer structure may provide an SOT-MRAM performing a magnetic field switching operation while having low critical current.

While example embodiments have been shown and described above, it will be apparent to those skilled in the art that modifications and variations could be made without departing from the scope of the present inventive concept as defined by the appended claims.

What is claimed is:

1. A magnetic device comprising:
a pinned layer having a fixed magnetization direction;
a free layer having a switched magnetization direction;
a tunnel insulating layer interposed between the pinned layer and the free layer; and
a spin-torque generation layer injecting spin current into the free layer as in-plane current flows,
wherein the spin current allows a magnetization direction of the free layer to be switched by a spin-orbit torque,
the pinned layer and the free layer have perpendicular magnetic anisotropy,
the spin-torque generation layer includes a tungsten layer and a tungsten-nitride layer sequentially stacked,
the tungsten-nitride layer is disposed adjacent to the free layer, and wherein the tungsten-nitride layer decreases a switching in-plane current of the spin-torque generation layer for the free layer.

2. The magnetic device of claim 1, wherein a thickness of the tungsten-nitride is 0.2 nm, and
nitrogen atomic percent of the tungsten-nitride layer is 5% to 42%.

3. The magnetic device of claim 1, wherein nitrogen atomic percent of the tungsten-nitride layer is 2% to 29%, and
a thickness of the tungsten-nitride is 0.2 nm to 0.8 nm.

4. The magnetic device of claim 1, wherein nitrogen atomic percent of the tungsten-nitride layer is 2% to 5%, and
a thickness of the tungsten-nitride is 0.2 nm to 3 nm.

5. The magnetic device of claim 1, wherein the tungsten-nitride layer includes a crystalline $W_2N$ (111) phase, or
the tungsten-nitride layer includes a crystalline $W_2N$ (111) phase and a crystalline WN (100) phase.

6. The magnetic device of claim 1, wherein the tungsten layer is vertically aligned with the free layer.

7. The magnetic device of claim 1, wherein the spin-torque generation layer further includes a ferromagnetic layer having in-plane magnetic anisotropy, and
the tungsten layer is disposed between the ferromagnetic layer and the tungsten-nitride layer.

8. The magnetic device of claim 1, wherein resistivity of the tungsten-nitride layer is 350 µΩ·cm or more.

9. A magnetic device comprising:
a pinned layer having a fixed magnetization direction;
a free layer having a switched magnetization direction;
a tunnel insulating layer interposed between the pinned layer and the free layer;
a spin-torque generation layer injecting spin current into the free layer as in-plane current flows; and
a tungsten-nitride layer disposed between the free layer and the spin-torque generation layer,
wherein the spin current allows a magnetization direction of the free layer to be switched by a spin-orbit torque,
the pinned layer and the free layer have perpendicular magnetic anisotropy,
the spin-torque generation layer includes a tungsten layer,
the tungsten-nitride layer is vertically aligned with the free layer, and
wherein the tungsten-nitride layer decreases a switching in-plane current of the spin-torque generation layer for the free layer.

10. A magnetic device comprising:
a pinned layer having a fixed magnetization direction;
a free layer having a switched magnetization direction;
a tunnel insulating layer interposed between the pinned layer and the free layer; and
a spin-torque generation layer injecting spin current into the free layer as in-plane current flows,
wherein the spin current allows a magnetization direction of the free layer to be switched by a spin-orbit torque,
the pinned layer and the free layer have perpendicular magnetic anisotropy,
the spin-torque generation layer includes a tungsten-nitride layer,
nitrogen atomic percent of the tungsten-nitride layer is 2% to 5%,
the tungsten-nitride layer is disposed adjacent to the free layer, and
wherein the tungsten-nitride layer decreases a switching in-plane current of the spin-torque generation layer for the free layer.

* * * * *